US011563002B2

(12) United States Patent
Kim et al.

(10) Patent No.: US 11,563,002 B2
(45) Date of Patent: Jan. 24, 2023

(54) SEMICONDUCTOR DEVICES HAVING GATE ELECTRODES AND METHODS OF MANUFACTURING THE SAME

(71) Applicant: Samsung Electronics Co., Ltd., Suwon-si (KR)

(72) Inventors: Jin Woo Kim, Hwaseong-si (KR); Choelhwyi Bae, Hwaseong-si (KR); Yang Gyeom Kim, Hwaseong-si (KR); Sung Eun Kim, Hwaseong-si (KR); Sang Woo Pae, Hwaseong-si (KR); Hyun Chui Sagong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 395 days.

(21) Appl. No.: 16/418,366

(22) Filed: May 21, 2019

(65) Prior Publication Data

US 2020/0185383 A1 Jun. 11, 2020

(30) Foreign Application Priority Data

Dec. 5, 2018 (KR) ........................ 10-2018-0154900

(51) Int. Cl.
*H01L 27/092* (2006.01)
*H01L 27/11* (2006.01)
(Continued)

(52) U.S. Cl.
CPC .... *H01L 27/0922* (2013.01); *H01L 21/28088* (2013.01); *H01L 21/765* (2013.01);
(Continued)

(58) Field of Classification Search
CPC ......... H01L 29/66545; H01L 29/66795; H01L 29/785; H01L 21/823821; H01L 21/823431
See application file for complete search history.

(56) References Cited

U.S. PATENT DOCUMENTS 9,337,109 B2     5/2016   Doornbos et al.
9,412,616 B1 *   8/2016   Xie ..................... H01L 27/1211
(Continued)

FOREIGN PATENT DOCUMENTS

KR   10-2017-0022262 A   3/2017
KR   10-2017-0088730 A   8/2017
(Continued)

*Primary Examiner* — Marcos D. Pizarro
*Assistant Examiner* — Quinton A Brasfield
(74) *Attorney, Agent, or Firm* — Harness, Dickey & Pierce, P.L.C.

(57) ABSTRACT

A semiconductor device includes a first fin that protrudes from a substrate and extends in a first direction, a second fin that protrudes from the substrate and extends in the first direction, the first fin and the second fin being spaced apart, a gate line including a dummy gate electrode and a gate electrode, the dummy gate electrode at least partially covering the first fin, the gate electrode at least partially covering the second fin, the dummy gate electrode including different materials from the gate electrode, the gate line covering the first fin and the second fin, the gate line extending in a second direction different from the first direction, and a gate dielectric layer between the gate electrode and the second fin.

20 Claims, 16 Drawing Sheets

(51) Int. Cl.
  *H01L 29/40* (2006.01)
  *H01L 21/8238* (2006.01)
  *H01L 21/28* (2006.01)
  *H01L 21/765* (2006.01)
  *H01L 29/49* (2006.01)

(52) U.S. Cl.
  CPC ............. *H01L 21/823821* (2013.01); *H01L 21/823842* (2013.01); *H01L 27/0924* (2013.01); *H01L 27/1104* (2013.01); *H01L 29/402* (2013.01); *H01L 29/4966* (2013.01)

(56) References Cited

U.S. PATENT DOCUMENTS

| | | | |
|---|---|---|---|
| 9,553,092 B2 | 1/2017 | Bao et al. | |
| 9,634,118 B2 | 4/2017 | Kim | |
| 9,673,106 B2 | 6/2017 | Kim et al. | |
| 9,837,416 B2 | 12/2017 | Walke et al. | |
| 9,984,937 B1 | 5/2018 | Bi et al. | |
| 2009/0166743 A1* | 7/2009 | Pillarisetty | H01L 27/11 257/365 |
| 2010/0304555 A1* | 12/2010 | Kaneko | H01L 21/845 438/585 |
| 2015/0214227 A1* | 7/2015 | Kim | H01L 29/7848 257/369 |
| 2016/0379982 A1* | 12/2016 | You | H01L 29/7846 257/369 |
| 2017/0033101 A1* | 2/2017 | Sharma | H01L 27/0924 |
| 2017/0162570 A1* | 6/2017 | Shih | H01L 29/66545 |
| 2018/0040621 A1* | 2/2018 | Liaw | H01L 21/823821 |
| 2018/0061757 A1* | 3/2018 | Li | H01L 21/823431 |

FOREIGN PATENT DOCUMENTS

| | | |
|---|---|---|
| KR | 10-2017-0093672 A | 8/2017 |
| KR | 10-2017-0105742 A | 9/2017 |
| KR | 10-2017-0106031 A | 9/2017 |

\* cited by examiner

FIG. 5
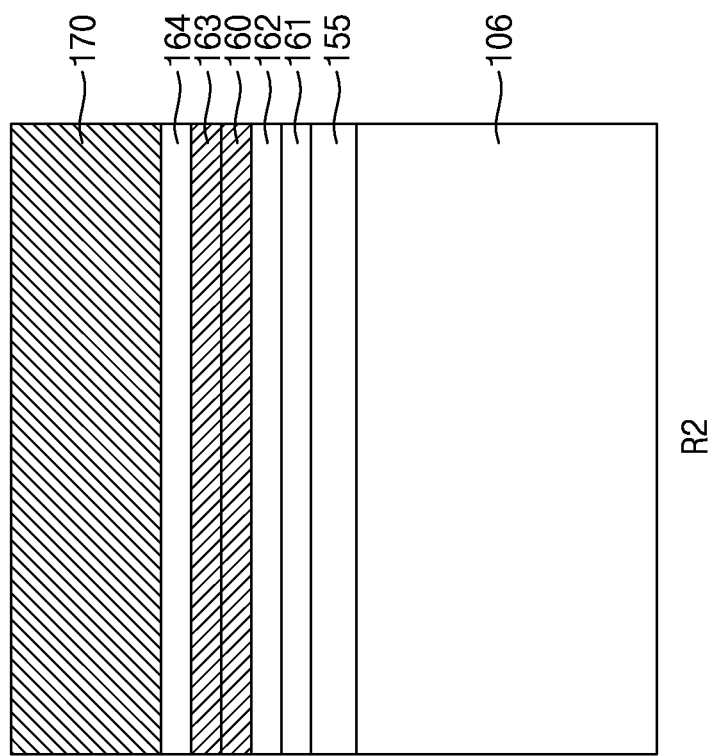
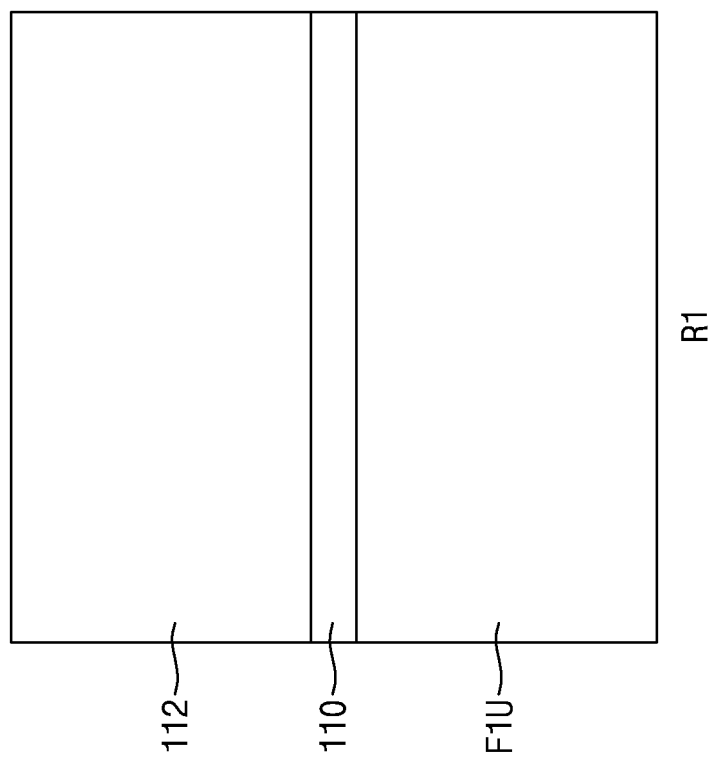

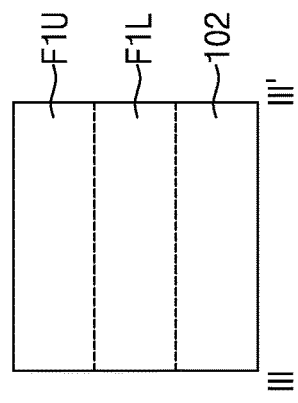
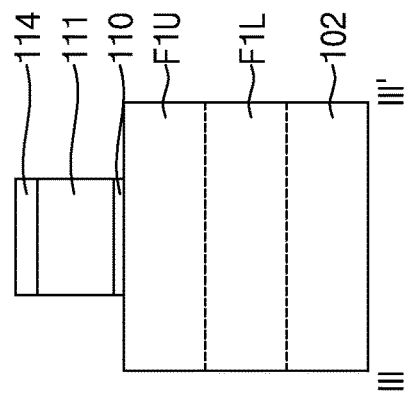
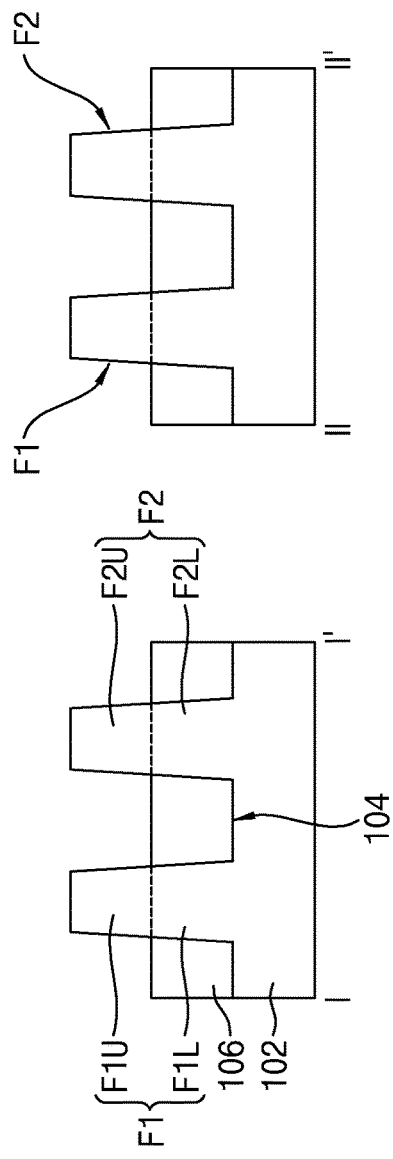
FIG. 11
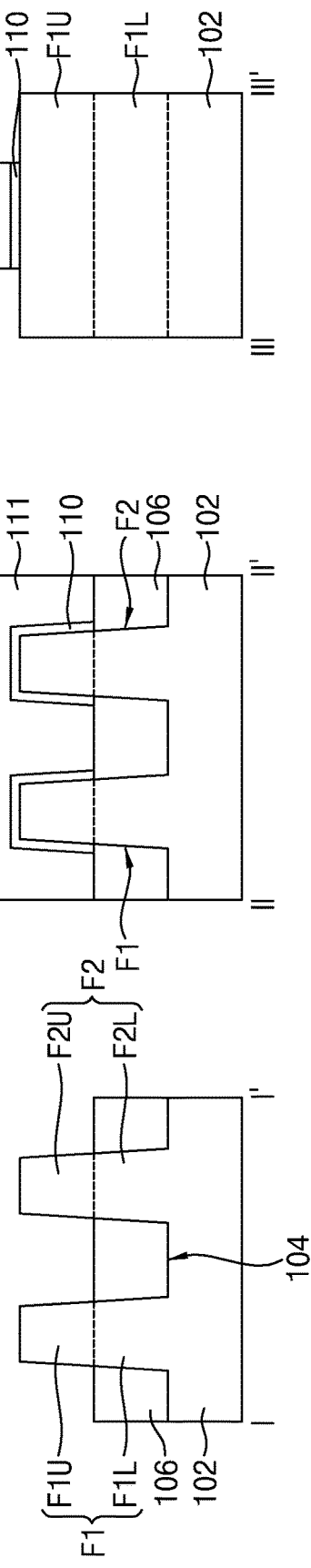
FIG. 12

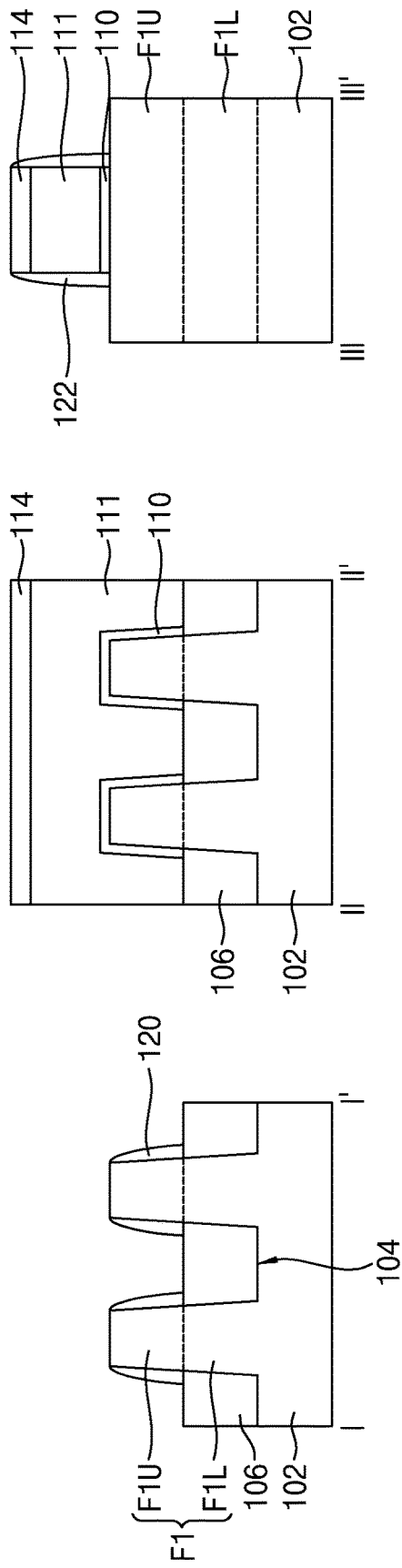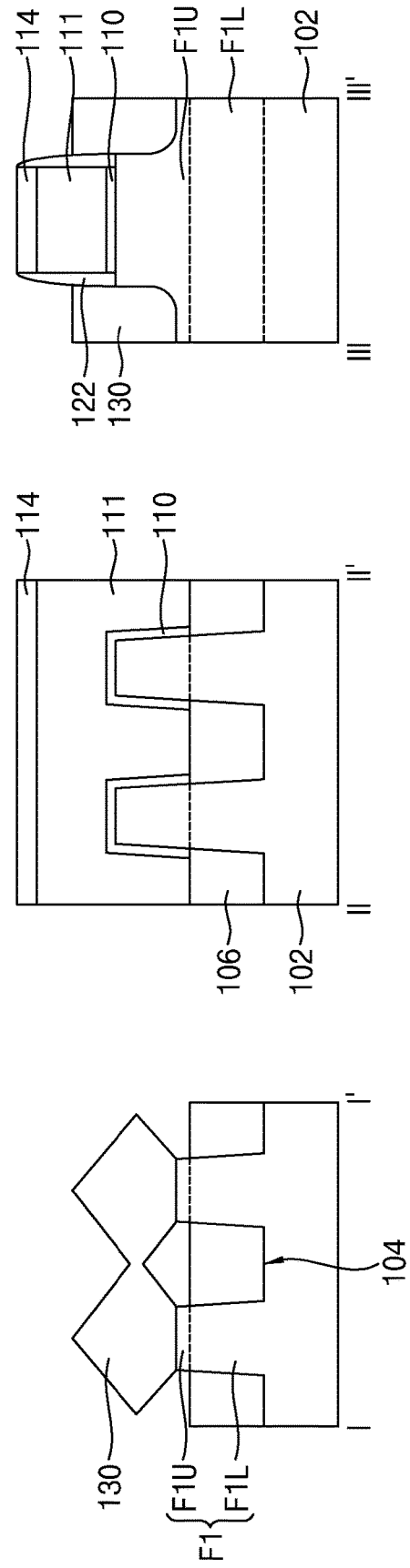

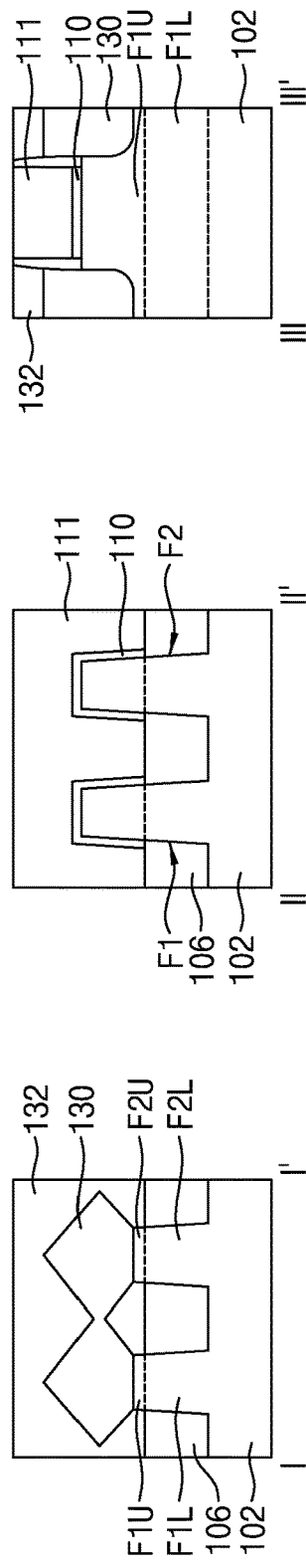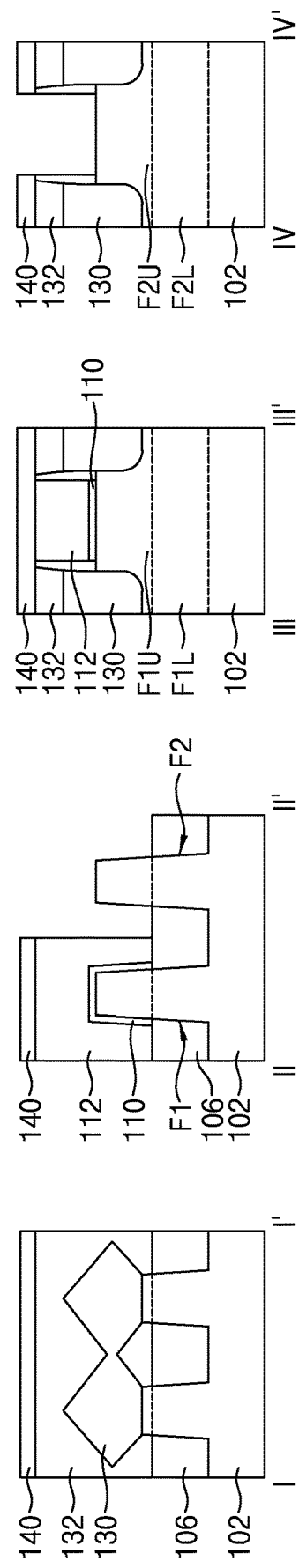

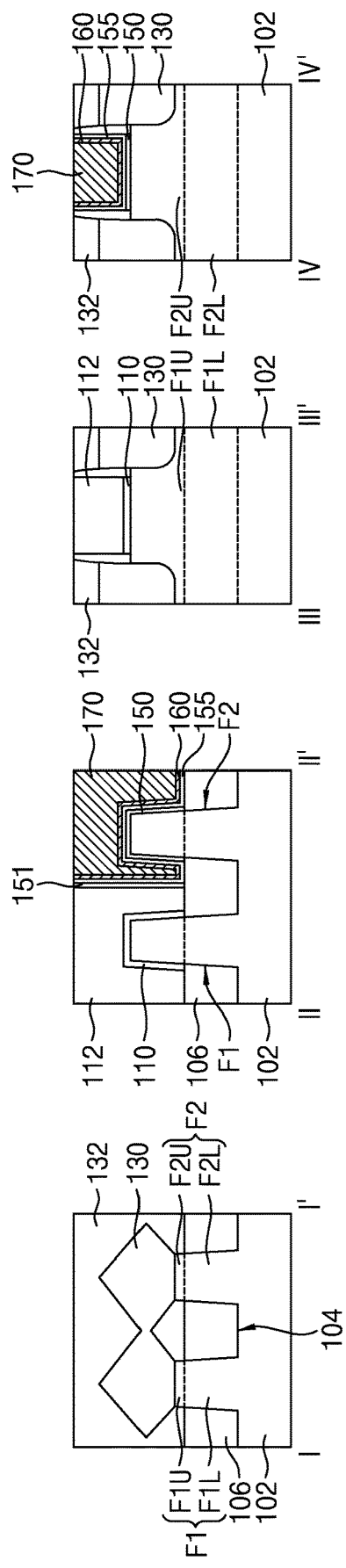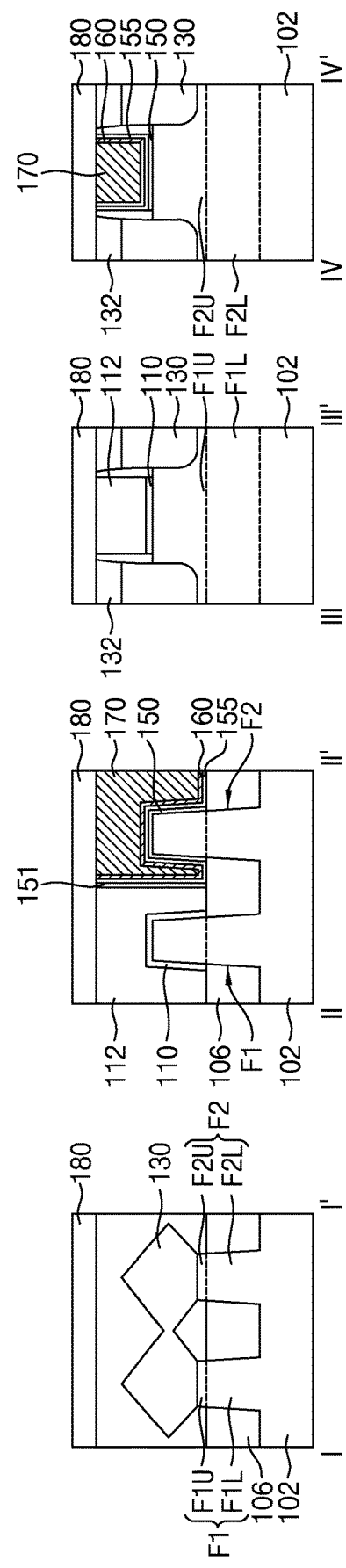

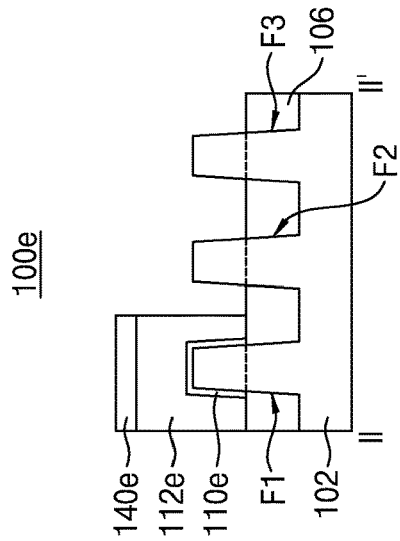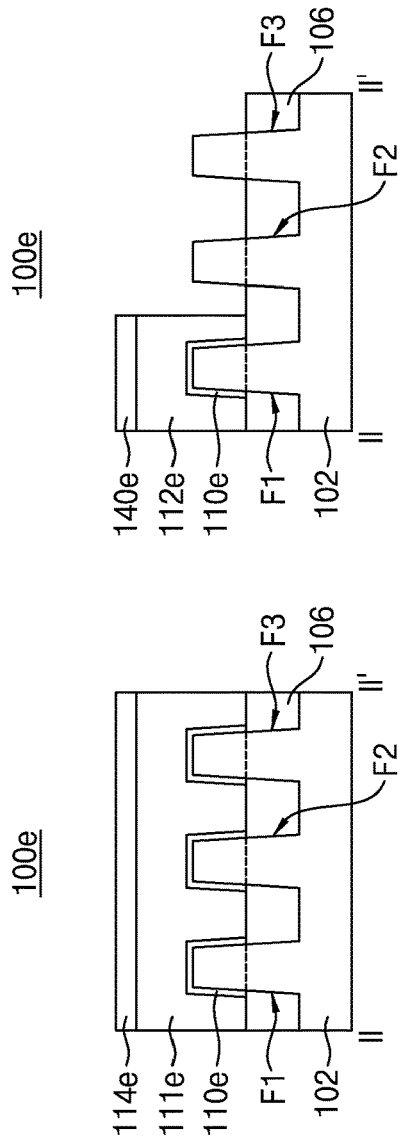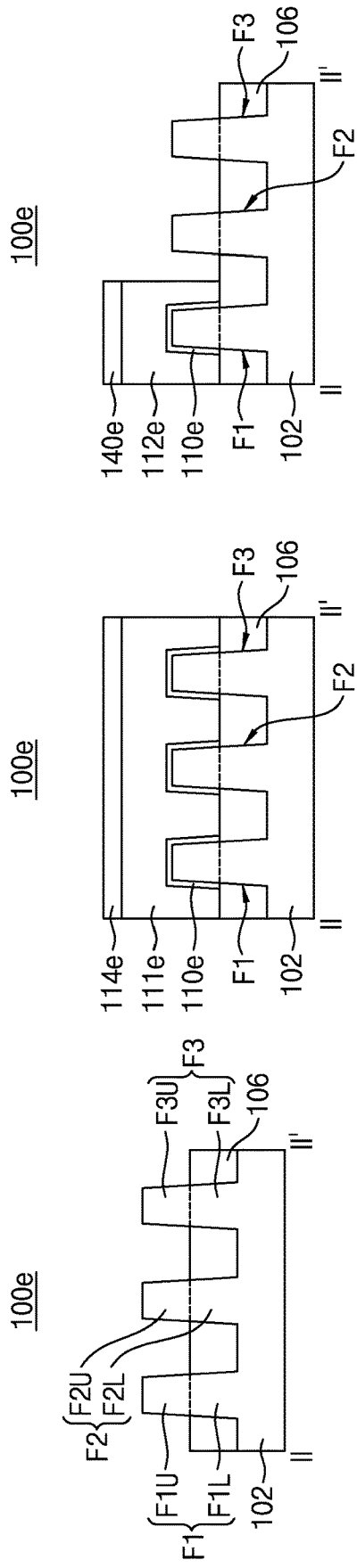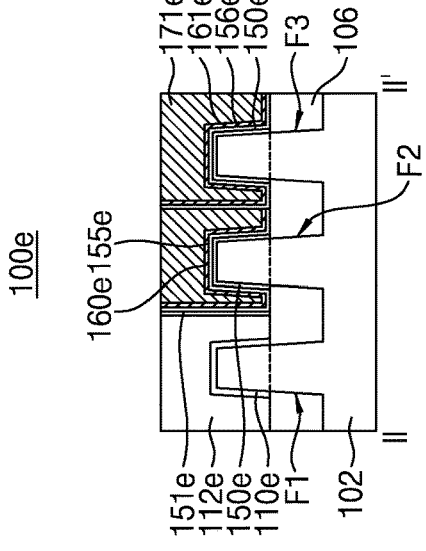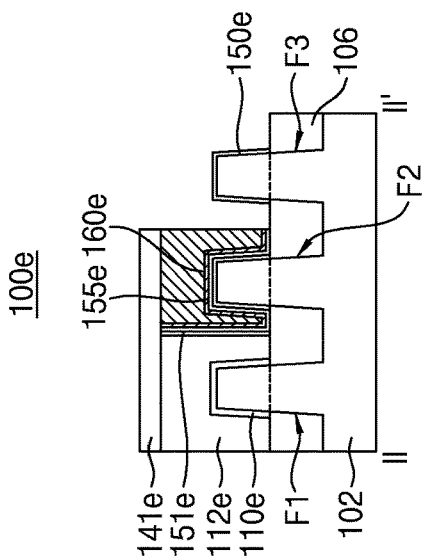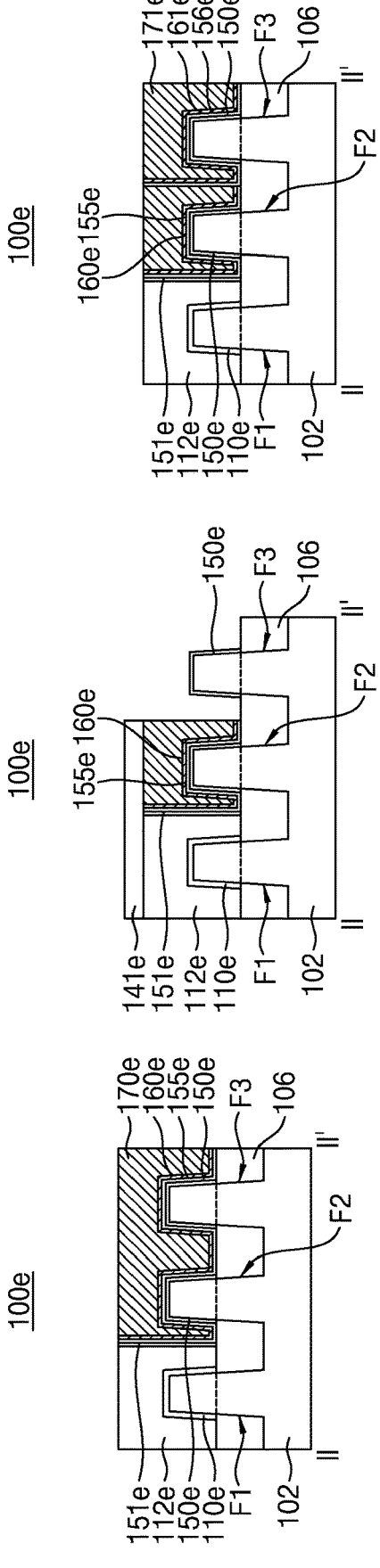

SEMICONDUCTOR DEVICES HAVING GATE ELECTRODES AND METHODS OF MANUFACTURING THE SAME

CROSS-REFERENCE TO RELATED APPLICATION

This application claims priority under 35 U.S.C. § 119 from Korean Patent Application No. 10-2018-0154900, filed on Dec. 5, 2018, the disclosure of which is incorporated herein by reference in its entirety.

BACKGROUND

1. Field

The inventive concepts relates to a semiconductor devices having gate electrodes and a methods of manufacturing the same.

2. Description of Related Art

Fin-type field effect transistors (FinFET) have been developed to overcome the limitations of conventional FETs with respect to highly integrated semiconductor devices. The FinFETs have a three-dimensional structure in contrast to planar-type transistors. An FET is designed to have a low threshold voltage (LUT), a standard threshold voltage (SVT), or a high threshold voltage (HVT) according to desired speed and power characteristics. Generally, deposition is performed multiple times to realize multiple threshold voltages because a plurality of metal layers are formed on a gate dielectric layer to adjust a threshold voltage in a FinFET.

SUMMARY

Some example embodiments of the inventive concepts are directed to providing a semiconductor device including a gate electrode and a dummy gate electrode containing polysilicon.

In addition, some example embodiments of the inventive concepts are directed to providing a method of manufacturing a semiconductor element including a dummy gate electrode and a gate electrode.

According to some example embodiments, there is provided a semiconductor device a first fin that protrudes from a substrate and extends in a first direction, a second fin that protrudes from the substrate and extends in the first direction, the first fin and the second fin being spaced apart, a gate line including a dummy gate electrode and a gate electrode, the dummy gate electrode at least partially covering the first fin, the gate electrode at least partially covering the second fin, the dummy gate electrode including different materials from the gate electrode, the gate line covering the first fin and the second fin, the gate line extending in a second direction different from the first direction, and a gate dielectric layer between the gate electrode and the second fin.

According to some example embodiments, there is provided a semiconductor device including a first fin that protrudes from a substrate and extends in a first direction, a second fin that protrudes from the substrate and extends in the first direction, a third fin that protrudes from the substrate and extends in the first direction, the first fin, the second fin and the third fin being spaced apart, a gate line including a dummy gate electrode, a first gate electrode and a second gate electrode, the dummy gate electrode covering the first fin, the first gate electrode covering the second fin, the second gate electrode covering the third fin, the dummy gate electrode including different materials from the first gate electrode and the second gate electrode, the gate line extending in a second direction different from the first direction, a first gate dielectric layer between the first gate electrode and the second fin, and a second gate dielectric layer between the second gate electrode and the third fin.

According to some example embodiments, there is provided a semiconductor device including a fin that protrudes from a substrate and extends in a first direction, a gate line including a dummy gate electrode and a gate electrode, the dummy gate electrode covering a first side surface of the fin, the gate electrode covering a second side surface of the fin, the dummy gate electrode including different materials from the gate electrode, the gate line covering the fin and extending in a second direction different from the first direction, a dummy gate insulating layer between the dummy gate electrode and the fin, and a gate dielectric layer between the gate electrode and the fin.

According to some example embodiments, there is provided a method of manufacturing a semiconductor device, the method including forming a first fin and a second fin on a substrate, the first fin and the second fin extending in a first direction, forming a dummy gate electrode to cover the first fin and the second fin, the dummy gate electrode extending in a second direction different from the first direction, forming a plurality of source/drain regions, source/drain regions among the plurality of source/drain regions being formed on the first fin and the second fin at both sides of the dummy gate electrode, removing a part of the dummy gate electrode, and forming a gate structure in a region in which the part of the dummy gate electrode is removed, the gate structure including a gate dielectric layer, a work function adjusting layer, and a gate electrode, the gate dielectric layer, the work function adjusting layer, and the gate electrode being sequentially stacked.

BRIEF DESCRIPTION OF THE DRAWINGS

FIG. 5 is an enlarged view of a part of the semiconductor device shown in FIG. 3.

FIGS. 10 to 18 depict a perspective view and cross-sectional views, which are illustrated according to the order of processes, for describing a method of manufacturing the semiconductor device 100 according to an example embodiment of the inventive concepts.

FIGS. 19 to 24 are cross-sectional views, which are illustrated according to the order of processes, for describing a method of manufacturing a semiconductor device according to an example embodiment of the inventive concepts.

DETAILED DESCRIPTION

Figure 1:
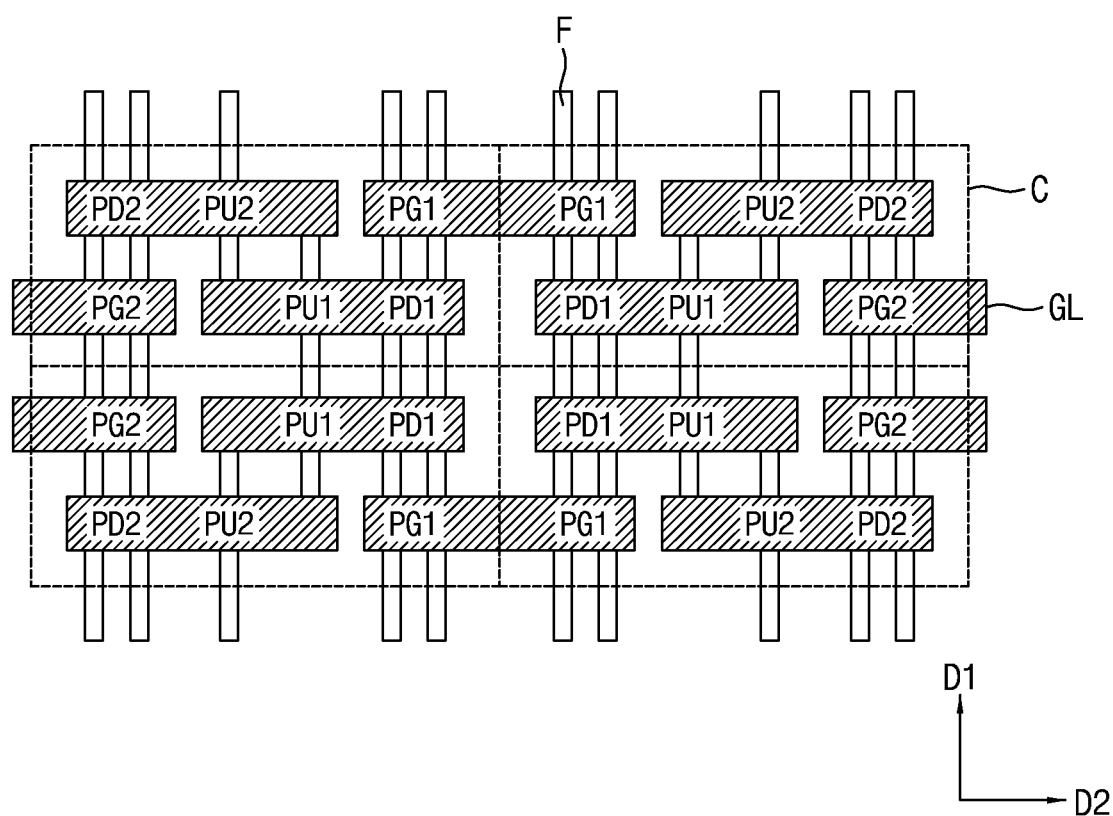
FIG. 1 is a plan view for describing a semiconductor device according to an example embodiment of the inventive concepts.

FIG. 1 is a plan view for describing a semiconductor device 100 according to an example embodiment of the inventive concepts.

FIG. 1 shows a layout of four memory cells C, each of which includes six fin-type field effect transistors (FinFETs). Each of the four memory cells C may be a static random access memory (SRAM) cell. Each of the four memory cells C may include fins F and gate lines GL. The fins F may be disposed to extend in a first direction D1 to be spaced apart parallel to one another. The gate lines GL may be disposed to extend in a second direction D2 perpendicular to the fins F. Although not shown in the drawing, an insulating layer may be disposed between the gate lines GL which are spaced apart from one another.

Each of the four memory cells C may include a first pull-up transistor PU1, a first pull-down transistor PD1, a first pass gate PG1, a second pull-up transistor PU2, a second pull-down transistor PD2, and a second pass gate PG2. The first pull-down transistor PU1 and the second pull-up transistor PU2 may be constituted of p-type metal oxide semiconductor (PMOS) transistors, the first pull-down transistor PD1 and the second pull-down transistor PD2 may be constituted of n-type MOS (NMOS) transistors, and the first pass gate PG1 and the second pass gate PG2 may be constituted of NMOS transistors. The first pull-down transistor PU1 and the second pull-up transistor PU2 may be located in an n-well, and the first pull-down transistor PD1, the second pull-down transistor PD2, the first pass gate PG1, and the second pass gate PG2 may be located in a p-well.

The above-described transistors may be formed at intersections of the fins F and the gate lines GL. Each of the first pull-up transistor PU1 and the second pull-up transistor PU2 may include a single fin F, and each of the first pull-down transistor PD1, the second pull-down transistor PD2, the first pass gate PG1, and the second pass gate PG2 may include two fins F.

In a single memory cell C, the first pull-down transistor PD1 and the first pass gate PG1 may share the same fin F. The first pull-down transistor PD1 and the first pull-up transistor PU1 may share a single gate line GL.

Figure 2:
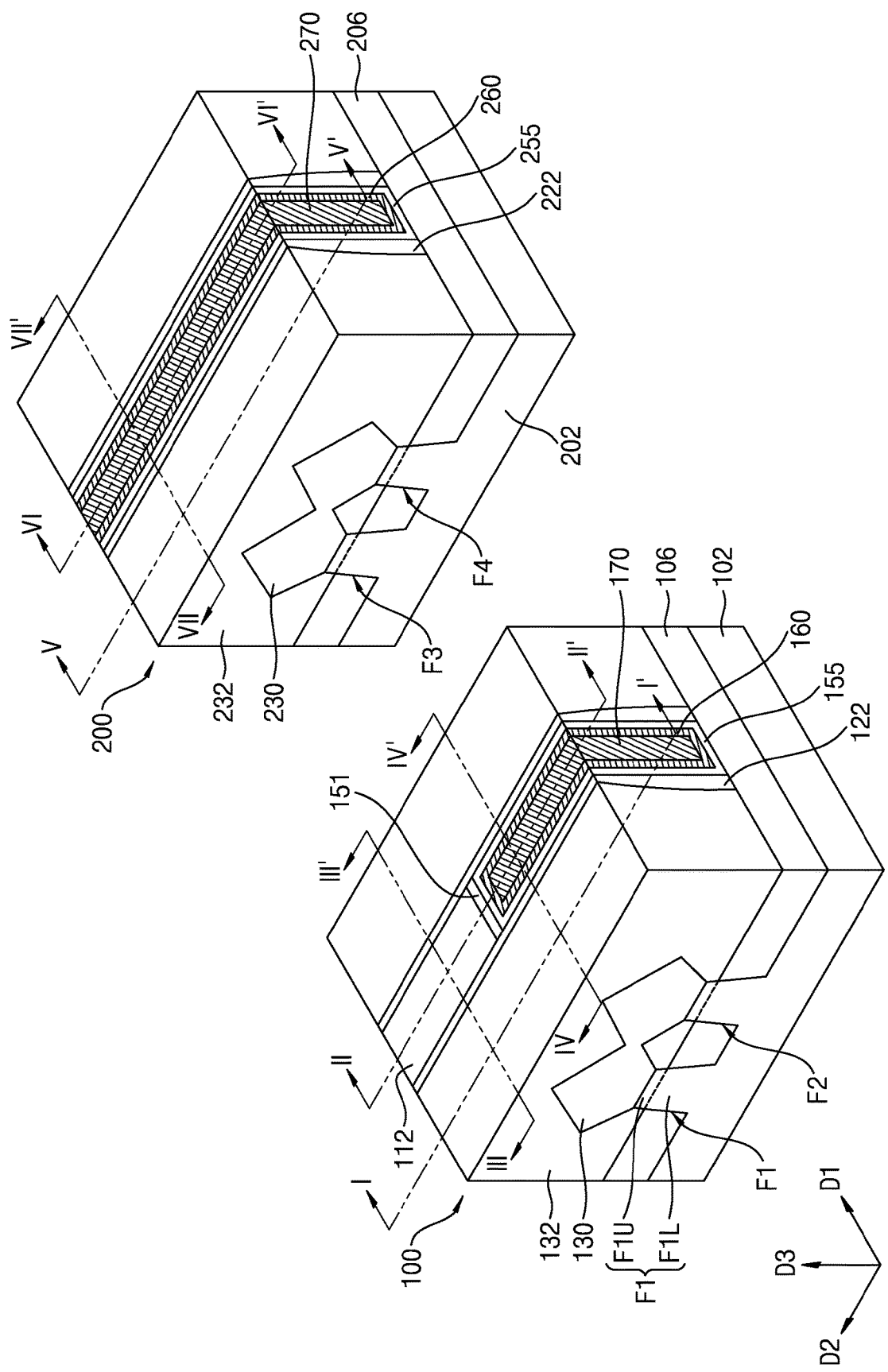
FIG. 2 depicts perspective views of semiconductor devices according to an example embodiment of the inventive concepts.
Figure 3:
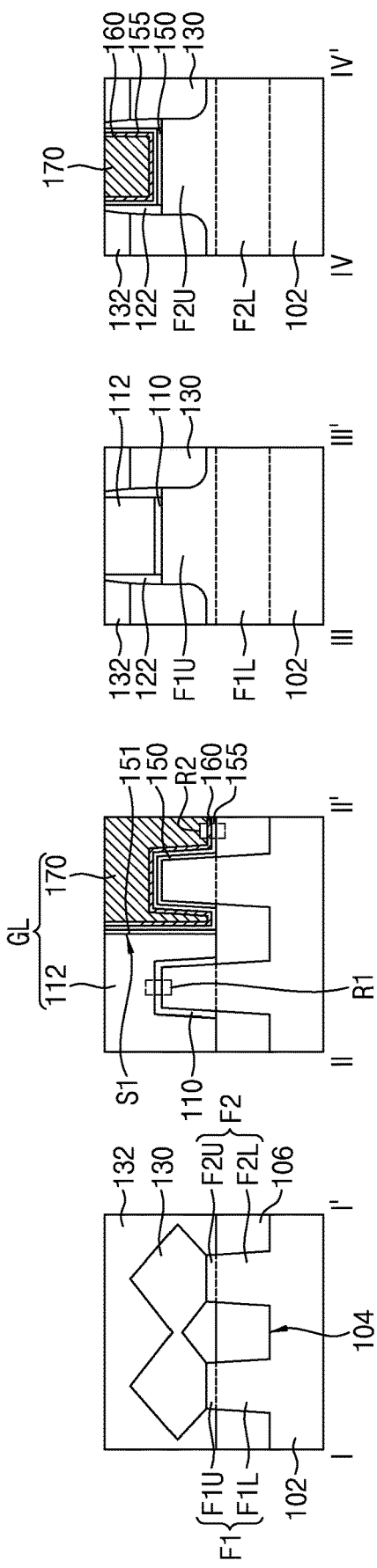
FIG. 3 depicts vertical cross-sectional views taken along lines I-I', II-II' III-III', and IV-IV' of the semiconductor device shown in FIG. 2.
Figure 4:
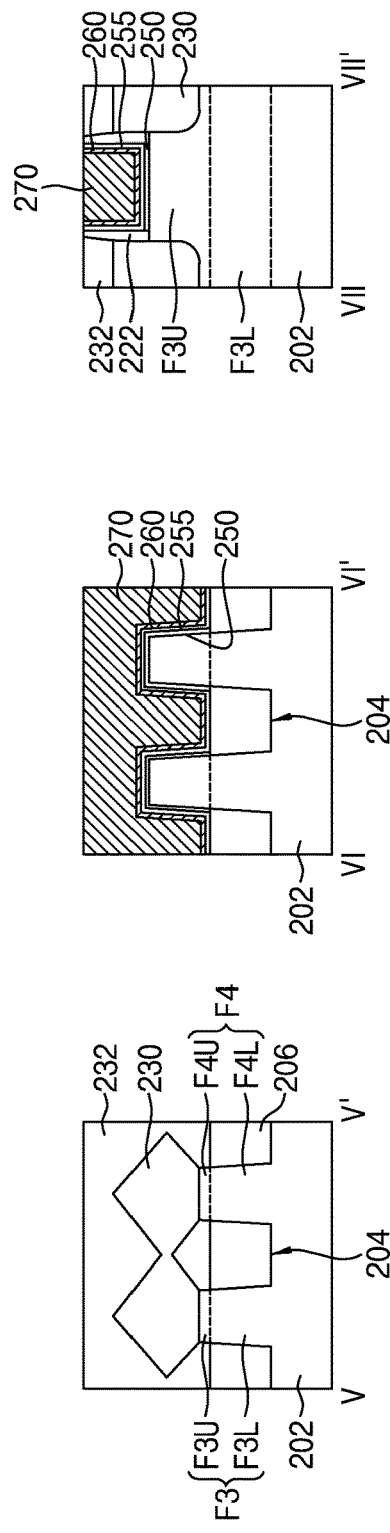
FIG. 4 depicts vertical cross-sectional views taken along lines V-V', VI-VI', and VII-VII' of the semiconductor device shown in FIG. 2.

FIG. 2 depicts perspective views of semiconductor devices 100 and 200 according to an example embodiment of the inventive concepts. FIG. 3 depicts vertical cross-sectional views taken along lines I-I', II-II', III-III', and IV-IV' of the semiconductor device 100 shown in FIG. 2. FIG. 4 depicts vertical cross-sectional views taken along lines V-V', VI-VI', and VII-VII' of the semiconductor device 200 shown in FIG. 2. The semiconductor devices 100 and 200 may be transistors used in an n-type FET (NFET) device, a p-type FET (PFET) device, a complementary MOS (CMOS) device and/or a logic of an SRAM device. In an example embodiment, the semiconductor device 100 may correspond to the first pull-down transistor PD1 and/or the second pull-down transistor PD2 of FIG. 1, and the semiconductor device 200 may correspond to the first pass gate PG1 and/or the second pass gate PG2.

Referring to FIGS. 2 and 3, the semiconductor device 100 may include a substrate 102, an element isolation layer 106, a gate spacer 122, source/drain regions 130, an interlayer insulating layer 132, and a gate electrode 170. The semiconductor device 100 may further include a first fin F1, a second fin F2, and a dummy gate electrode 112.

The semiconductor device 100 may include the first fin F1 and the second fin F2 which are formed to protrude from the substrate 102 and extend in the first direction D1. A gate line GL may include the dummy gate electrode 112 and the gate electrode 170. The gate line GL may be formed to surround (e.g., cover) side surfaces and upper surfaces of the first fin F1 and the second fin F2 and extend in the second direction D2. For example, the gate line GL may cover a first side surface, a second side surface and an upper surface of the first fin F1, and may cover a first side surface, a second side surface and an upper surface of the second fin F2.

The substrate 102 may include a semiconductor material. For example, the substrate 102 may be a silicon substrate, a germanium substrate, a silicon germanium substrate, and/or a silicon on insulator (SOI) substrate.

A recessed region 104 may be formed between the first fin F1 and the second fin F2, and the element isolation layer 106 may partially cover the recessed region 104. The first fin F1 and the second fin F2 may be divided into upper regions F1U and F2U located on the element isolation layer 106 and lower regions F1L and F2L of which side surfaces are covered by the element isolation layer 106. The first fin F1 and the second fin F2 may include a material identical or similar to that of the substrate 102. In FIG. 2, the two fins F1 and F2 have been shown as being provided at the semiconductor device 100, but the inventive concepts is not limited thereto. In an example embodiment, the semiconductor device 100 may include a single fin or three or more fins.

The element isolation layer 106 may be formed to cover an upper surface of the substrate 102 and the side surfaces of the lower regions F1L and F2L of the first fin F1 and the second fin F2, respectively. The element isolation layer 106 may fill a part of the recessed region 104. An upper end of the element isolation layer 106 may be located at a level that is lower than upper ends of the first fin F1 and the second fin F2. The element isolation layer 106 may include silicon oxide, silicon nitride, silicon oxynitride, and/or a low dielectric (low-K) material.

The source/drain regions 130 may be disposed on the first fin F1 and the second fin F2. The source/drain regions 130 may be located on both side surfaces of each of the dummy gate electrode 112 and the gate electrode 170. The source/drain regions 130 may be electrically insulated from the dummy gate electrode 112 and/or the gate electrode 170 by the gate spacer 122. The source/drain regions 130 may be formed by selective epitaxial growth (SEG) and may be grown from the first fin F1 and the second fin F2 and merged. The source/drain regions 130 may be doped with impurities.

For example, when the semiconductor device 100 is an NMOS transistor, the source/drain regions 130 may include silicon containing n-type impurities and may have lattice constants that are less than a lattice constant of silicon. The source/drain regions 130 may improve mobility of carriers by applying tensile stress to the first fin F1 and the second fin F2 which are channel regions.

When the semiconductor device 100 is a PMOS transistor, the source/drain regions 130 may include silicon germanium (SiGe) containing p-type impurities and may have lattice constants that are greater than a lattice constant of silicon. The source/drain regions 130 may improve mobility of carriers by applying compressive stress to the first fin F1 and the second fin F2.

The interlayer insulating layer 132 may be disposed on the source/drain regions 130 and outside the gate spacer 122. The interlayer insulating layer 132 may entirely or substantially cover the source/drain regions 130. However, in an example embodiment, the interlayer insulating layer 132 may not be filled below the source/drain regions 130. The interlayer insulating layer 132 may include silicon oxide, silicon nitride, silicon oxynitride, and/or a low-k material and may be constituted of one or more layers.

A dummy gate structure may be disposed inside the gate spacer 122 and may be formed to surround the side surface and the upper surface of the upper region F1U of the first fin F1 and extend in the second direction D2. The dummy gate structure may include a dummy gate insulating layer 110 and the dummy gate electrode 112.

The dummy gate insulating layer 110 may be disposed along a side surface and an upper surface of the first fin F1. In an example embodiment, the dummy gate insulating layer 110 may also be disposed on the element isolation layer 106. The dummy gate insulating layer 110 may electrically insulate the element isolation layer 106 from the dummy gate electrode 112. The dummy gate insulating layer 110 may include silicon oxide.

The dummy gate electrode 112 may be disposed on the dummy gate insulating layer 110. The dummy gate electrode 112 may be formed to surround the side surface and the upper surface of the upper region F1U of the first fin F1 and extend in the second direction D2. The dummy gate insulating layer 110 and the dummy gate electrode 112 may be sequentially stacked on the upper surface of the upper region F1U of the first fin F1 in a Region R1. The dummy gate electrode 112 may include polysilicon and/or n-type or p-type impurities. For example, when the semiconductor device 100 is an NMOS transistor, the dummy gate electrode 112 may include n-type impurities. When the semiconductor device 100 is a PMOS transistor, the dummy gate electrode 112 may include a p-type impurity. The dummy gate electrode 112 contains impurity-containing polysilicon such that the dummy gate electrode 112 may serve as a configuration of a transistor.

A gate structure may be disposed inside the gate spacer 122 and may be formed to surround the side surface and the upper surface of the upper region F2U of the second fin F2 and extend in the second direction D2. The gate structure may include an interface layer 150, a gate oxide layer 151, a gate dielectric layer 155, a work function adjusting layer 160, and the gate electrode 170.

The interface layer 150 may be disposed on a surface of the upper region F2U of the second fin F2. The interface layer 150 may include a low-k material. In an example embodiment, the interface layer 150 may include silicon oxide. The interface layer 150 has a thickness that is less than that of the dummy gate insulating layer 110 and is able to prevent or reduce a defective interface between the second fin F2 and the gate dielectric layer 155.

The gate oxide layer 151 may also be formed between the dummy gate electrode 112 and the gate electrode 170. In an example embodiment, the gate oxide layer 151 may be formed on a side surface S1 of the dummy gate electrode 112 in the first direction D1 by oxidizing the dummy gate electrode 112 including polysilicon.

The gate dielectric layer 155 may be disposed on the element isolation layer 106 and the interface layer 150. The gate dielectric layer 155 may be disposed between the dummy gate electrode 112 and the gate electrode 170. The gate dielectric layer 155, the work function adjusting layers 160 and the gate electrode 170 may be sequentially stacked on the element isolation layer 106 in a Region R2. The gate dielectric layer 155 may include a high dielectric (high-k) material. For example, the gate dielectric layer 155 may include hafnium oxide ($HfO_2$).

The work function adjusting layer 160 may be disposed on the gate dielectric layer 155. The work function adjusting layer 160 may cover the upper region F2U of the second fin F2 and may be disposed between the dummy gate electrode 112 and the gate electrode 170. The gate oxide layer 151, the gate dielectric layer 155, and the work function adjusting layer 160 may be sequentially disposed in a direction (e.g., a direction opposite from the second direction) from the side surface of the dummy gate electrode 112 to the gate electrode 170. The work function adjusting layer 160 may be constituted of one or more layers. The work function adjusting layer 160 may include TiAl, and/or metal nitride such as TiAlN, TaCN, TaN, TaAlN and/or the like.

The gate electrode 170 may be formed on the work function adjusting layer 160 to fill in all or some of the remaining space of the gate line GL. The gate electrode 170 may include aluminum, copper, titanium, tantalum, tungsten, molybdenum, tantalum nitride, nickel silicide, cobalt silicide, TiN, WN, TiAl, TiAlN, TaCN, TaC, TaSiN, a metal alloy, and/or a combination thereof. In an example embodiment, the gate electrode 170 may include tungsten. A lower surface of the gate electrode 170 may be located at a level that is higher than a lower surface of the dummy gate electrode 112.

The gate spacer 122 may be disposed outside the dummy gate electrode 112 and the gate electrode 170 in the second direction D2. The gate spacer 122 may protect the dummy gate electrode 112 and the gate electrode 170. The gate spacer 122 may be constituted of one or more layers. Although not shown in the drawing, the semiconductor device 100 may further include a capping layer. The capping layer may be disposed on the gate spacer 122, the interlayer insulating layer 132, and the gate electrode 170.

FIG. 4 is vertical cross-sectional views taken along lines V-V', VI-VI', and VII-VII' of the semiconductor device 200 shown in FIG. 2. A detailed description of a configuration of the semiconductor device 200 which is identical or similar to the configuration of semiconductor device 100 will be omitted. For example, the substrate 202, the gate spacer 222, the source/drain regions 230, the interlayer insulating layer 232, the recessed region 204, the third fin F3 and the fourth fin F4 of the semiconductor device 200 may be the same as or similar to the substrate 102, the gate spacer 122, the source/drain regions 130, the interlayer insulating layer 132, the recessed region 104, the first fin F1 and the second fin F2 of the semiconductor device 100.

The semiconductor device 200 may have a configuration similar to that of the above-described semiconductor device 100. The semiconductor device 200 may include a third fin F3 and a fourth fin F4 which are formed to extend in the first direction D1. The gate electrode 270 surrounds the third fin F3 and fourth fin F4 and may be disposed extending along the second direction D2.

An interface layer 250 may be disposed along surfaces of upper regions F3U and F4U of the third fin F3 and the fourth fin F4. A gate dielectric layer 255 may be disposed on the element isolation layer 206 and the interface layer 250. A work function adjusting layer 260 may be disposed on the gate dielectric layer 255. The work function adjusting layer 260 of the semiconductor device 200 may include a material identical or similar to that of the work function adjusting layer 160 of the semiconductor device 100. A gate electrode 270 may be disposed on the work function adjusting layer 260 to surround (e.g., cover) the third fin F3 and the fourth fin F4.

As shown in FIGS. 2 and 4, the gate dielectric layer 255, the work function adjusting layer 260, and the gate electrode 270 of the semiconductor device 200 may be disposed to surround both of the two fins F3 and F4. As shown in FIG. 3, the gate dielectric layer 155, the work function adjusting layer 160, and the gate electrode 170 of the semiconductor device 100 are not disposed on the first fin F1. As shown in FIG. 2, the gate spacer 122 may be disposed between the dummy gate electrode 112 and the interlayer insulating layer 132, and the gate dielectric layer 155 and the work function adjusting layer 160 may be disposed between the interlayer insulating layer 132 and the gate electrode 170. Consequently, the semiconductor device 100 may be formed such that a width of the dummy gate electrode 112 in the first direction D1 may be wider than that of the gate electrode 170 in the first direction D1. In general, in order to realize a semiconductor device having multiple work functions in a transistor, a thickness of a work function adjusting layer, the number of layers thereof, and/or a material thereof may be adjusted appropriately. As shown in FIGS. 2 and 3, the first fin F1 of the semiconductor device 100 is covered by the dummy gate electrode 112 such that the semiconductor device 100 may have a threshold voltage different from that of the semiconductor device 200. The dummy gate insulating layer 110 disposed below the dummy gate electrode 112 may also affect the threshold voltage.

FIG. 5 is an enlarged view of a part of the semiconductor device 100 shown in FIG. 3. FIG. 5 may correspond to Region R1 and Region R2 of FIG. 3.

Referring to FIG. 5, the dummy gate insulating layer 110 and the dummy gate electrode 112 may be sequentially stacked on the element isolation layer 106 in Region R1. The gate dielectric layer 155, a capping layer 161, an etch stop layer 162, work function adjusting layers 160 and 163, a barrier layer 164, and the gate electrode 170 may be sequentially stacked on the element isolation layer 106 in Region R2.

The capping layer 161 may include a metal nitride, e.g., TiN. The etch stop layer 162 may include a metal nitride, e.g., tantalum nitride (TaN). The work function adjusting layer 160 may include TiN, and the work function adjusting layer 163 may include carbon, aluminum, or a combination thereof. For example, the work function adjusting layer 163 may include TiAlC. The barrier layer 164 may include TiN. Region R2 shown in FIG. 5 is illustrative and the inventive concepts is not limited thereto. The work function adjusting layers 160 and 163 may further include a one or more additional layers and/or other materials.

FIGS. 6 to 9 are cross-sectional views of semiconductor devices 100*a*, 100*b*, 100*c*, and 100*d* according to some example embodiments of the inventive concepts. Each of the cross-sectional views shows an example embodiment corresponding to the cross-sectional view taken along the line II-II' of FIGS. 2 and 3. A detailed description of a configuration which is similar or identical to the configuration of the semiconductor device 100 shown in FIGS. 2 and 3 will be omitted.

Figure 6:
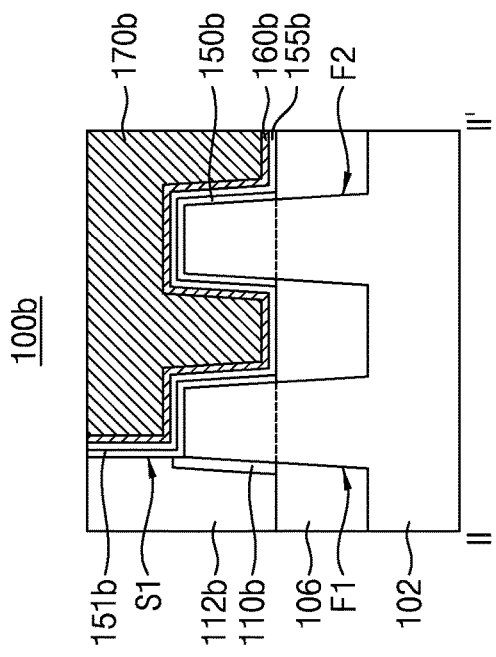
FIGS. 6 to 9 are cross-sectional views of semiconductor devices according to some example embodiments of the inventive concepts.

Referring to FIG. 6, the semiconductor device 100*a* may include a dummy gate insulating layer 110*a*, a dummy gate electrode 112*a*, an interface layer 150*a*, a gate oxide layer 151*a*, a gate dielectric layer 155*a*, a work function adjusting layer 160*a*, and a gate electrode 170*a*. A side surface S1 of the dummy gate electrode 112*a* in (e.g., with respect to) the first direction D1 may be located on the upper surface of the first fin F1. The dummy gate electrode 112*a* may cover a part of the upper surface and one side surface of the first fin F1, and the gate electrode 170*a* may cover the other side surface of the first fin F1 and the second fin F2. The other side surface of the first fin F1 may refer to a surface about the one side surface of the first fin F1 and opposite thereto.

The dummy gate insulating layer 110*a* may be disposed below the dummy gate electrode 112*a* and may cover the element isolation layer 106 and the side surface of the first fin F1. The interface layer 150*a* may be disposed along the surface of the upper region F2U of the second fin F2. The gate oxide layer 151*a* may be disposed along the side surface S1 of the dummy gate electrode 112*a* in the first direction D1 and one surface of the first fin F1. The gate dielectric layer 155*a* may be disposed below the gate electrode 170*a* and may be formed along the gate oxide layer 151*a*, the element isolation layer 106, and the interface layer 150*a*. The work function adjusting layer 160*a* may be disposed on the gate dielectric layer 155*a*.

Figure 7:
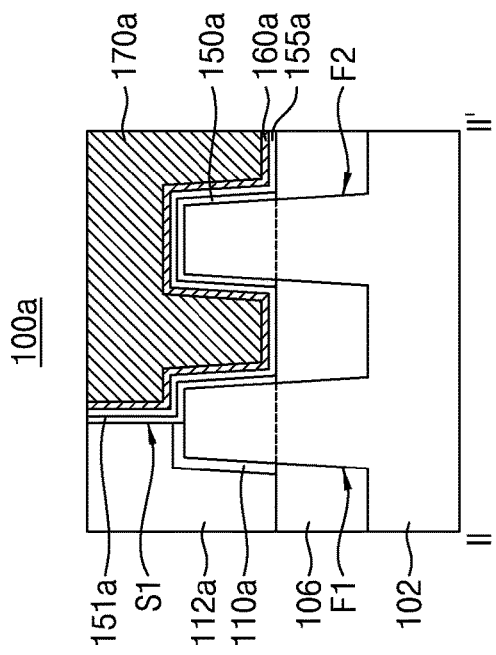

Referring to FIG. 7, the semiconductor device 100*b* may include a dummy gate insulating layer 110*b*, a dummy gate electrode 112*b*, an interface layer 150*b*, a gate oxide layer 151*b*, a gate dielectric layer 155*b*, a work function adjusting layer 160*b*, and a gate electrode 170*b*. A side surface S1 of the dummy gate electrode 112*b* in the first direction D1 may be located on one side surface of the first fin F1. The dummy gate electrode 112*b* may cover the one side surface of the first fin F1, and the gate electrode 170*b* may cover the second fin F2 and an upper surface and the other side surface of the first fin F1.

Referring to FIGS. 3, 6, and 7, in the semiconductor device 100*a* or 100*b*, a threshold voltage may be controlled by varying a ratio of the dummy gate electrode 112*a* or 112*b* to the gate electrode 170*a* or 170*b*. Although not shown in the drawing, the dummy gate electrode 112 may cover the first fin F1 and a part of the second fin F2, and the gate electrode 170 may cover the remaining part of the second fin F2.

Figure 8:
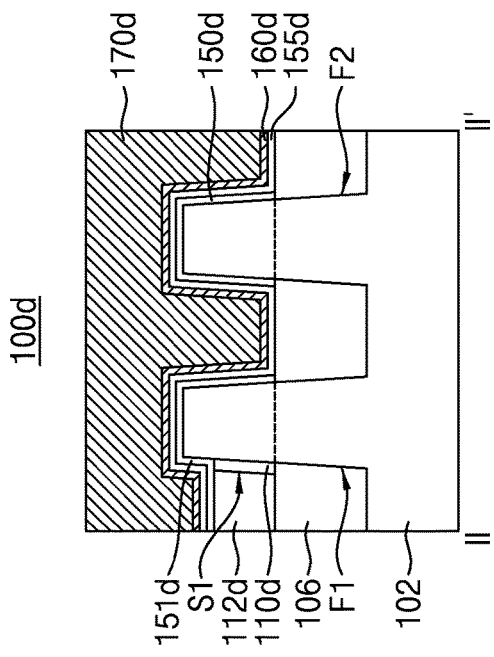

Referring to FIG. 8, the semiconductor device 100*c* may include a dummy gate insulating layer 110*c*, a dummy gate electrode 112*c*, an interface layer 150*c*, a gate oxide layer 151*c*, a gate dielectric layer 155*c*, a work function adjusting layer 160*c*, and a gate electrode 170*c*. A side surface S1 of the dummy gate electrode 112*c* in the first direction D1 may be located on one side surface of the first fin F1. The dummy gate electrode 112*c* may cover the one side surface of the first fin F1, and the gate electrode 170*c* may cover the second fin F2 and the other side surface of the first fin F1. The gate electrode 170*c* may cover the dummy gate electrode 112*c*.

The dummy gate insulating layer 110*c* may be disposed below the dummy gate electrode 112*c* and may cover the element isolation layer 106 and the side surface of the first fin F1. The interface layer 150*c* may be disposed along the surface of the upper region F2U of the second fin F2. The gate oxide layer 151*c* may be disposed along an upper surface of the dummy gate electrode 112*c*, a side surface thereof in the first direction D1, and a part of the first fin F1. The gate dielectric layer 155*c* may be disposed below the gate electrode 170*c* and may be formed along the gate oxide layer 151*c*, the element isolation layer 106, and the interface layer 150*c*. The work function adjusting layer 160*c* may be disposed on the gate dielectric layer 155*c*.

As shown in FIG. 8, the upper surface of the dummy gate electrode 112c may be located at a level that is lower than an upper surface of the gate electrode 170c. The gate oxide layer 151c, the gate dielectric layer 155c, the work function adjusting layer 160c, and the gate electrode 170c may be sequentially stacked on the dummy gate electrode 112c. In an example embodiment, the gate oxide layer 151c may be omitted.

Figure 9:
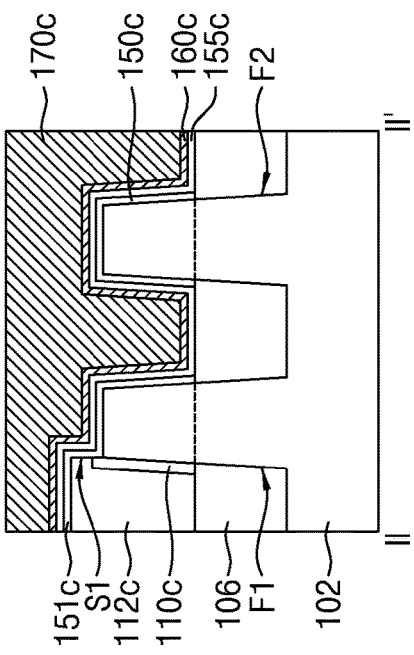

Referring to FIG. 9, the semiconductor device 100d may include a dummy gate insulating layer 110d, a dummy gate electrode 112d, an interface layer 150d, a gate oxide layer 151d, a gate dielectric layer 155d, a work function adjusting layer 160d, and a gate electrode 170d. The dummy gate electrode 112d may cover a part of one side surface of the first fin F1, and the gate electrode 170d may cover the second fin F2 and an upper surface and the other side surface of the first fin F1.

An upper surface of the dummy gate electrode 112d may be located at a level that is lower than an upper surface of the gate electrode 170d. The upper surface of the dummy gate electrode 112d may be located at a level that is lower than an upper end of the first fin F1. The gate oxide layer 151d, the gate dielectric layer 155d, the work function adjusting layer 160d, and the gate electrode 170d may be sequentially stacked on the dummy gate electrode 112d.

Referring to FIGS. 7 to 9, a height of the dummy gate electrode 112c or 112d in a third direction D3 is adjusted such that a content ratio of the dummy gate electrode 112c or 112d may be varied. As described above, a threshold voltage of the semiconductor device 100 may be controlled by adjusting the height of the dummy gate electrode 112. A dummy gate shown in FIGS. 8 and 9 may be formed by performing wet or dry etching for etching an upper portion of polysilicon.

When viewed from the vertical cross-sectional view taken along the line various threshold voltages may be implemented by varying an area ratio of the dummy gate electrode 112 to the gate electrode 170, which are included in the gate line GL, and/or an interface between the dummy gate electrode 112 and the gate electrode 170. In an example embodiment, the interface between the dummy gate electrode 112 and the gate electrode 170 may be a vertical surface. The vertical surface may be located at a left side, an upper side, or a right side of the first fin F1 or at an upper side or a right side of the second fin F2. In an example embodiment, the interface between the dummy gate electrode 112 and the gate electrode 170 may include a horizontal surface. The horizontal surface may be located at the left side of the first fin F1. The horizontal surface may be located at a level that is higher or lower than a level of the first fin F1. In an example embodiment, the interface between the dummy gate electrode 112 and the gate electrode 170 may include an inclined surface, a curved surface, and/or the like.

FIGS. 10 to 18 depict a perspective view and cross-sectional views, which are illustrated according to the order of processes, for describing a method of manufacturing the semiconductor device 100 according to an example embodiment of the inventive concepts.

Figure 10:
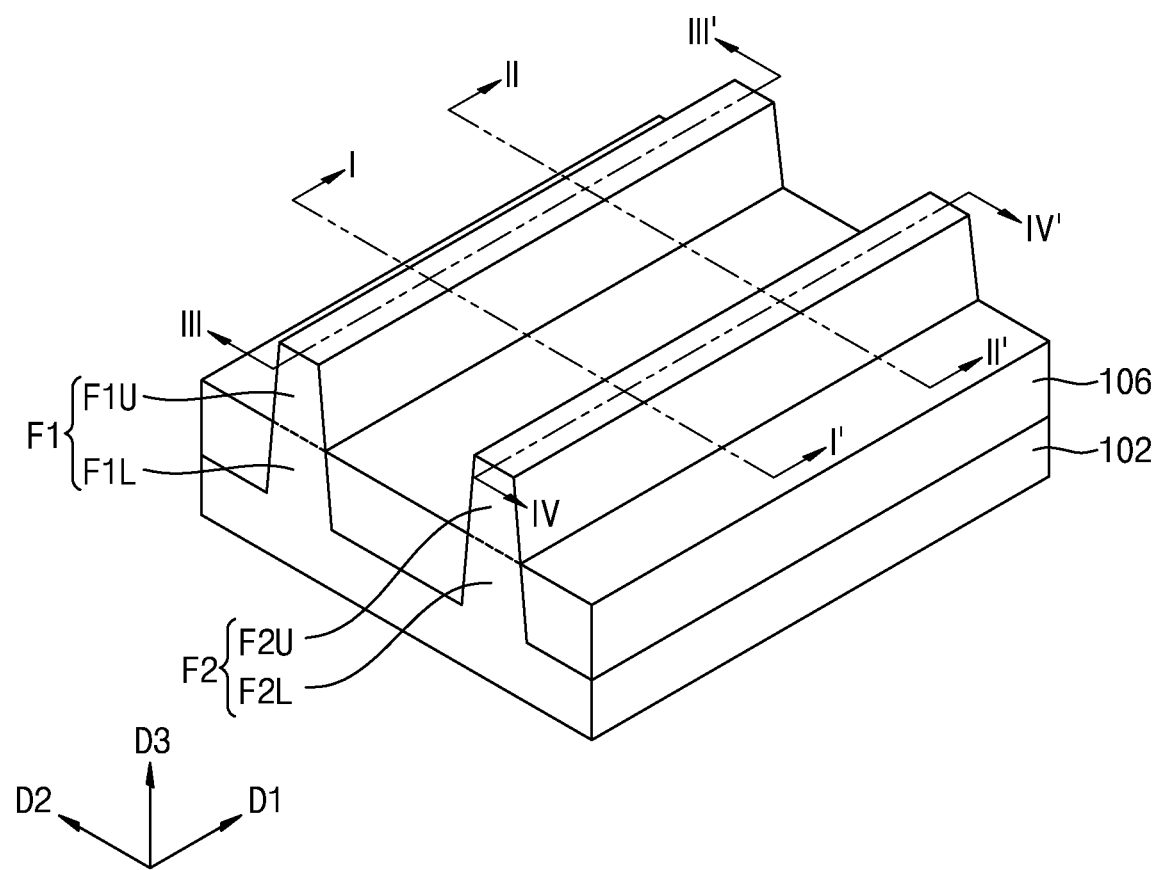

FIG. 10 is a perspective view illustrating the substrate 102, the first fin F1, the second fin F2, and the element isolation layer 106, and FIG. 11 is vertical cross-sectional views taken along lines I-I', II-II', and III-III' of FIG. 10. The line II-II' is a line in which the dummy gate electrode 112 and the gate electrode 170, which will be described below, are formed and the III-III' is a line along the first fin F1. The line IV-IV' is a line along the second fin F2 and discussed in association with FIGS. 16-18. A detailed description of a configuration of the second fin F2 which is identical or similar to the configuration of the first fin F1 will be omitted.

Referring to FIGS. 10 and 11, the first fin F1, the second fin F2, and the element isolation layer 106 may be prepared on the substrate 102. The first fin F1 and the second fin F2 may be disposed on the substrate 102 to protrude in the third direction D3 and extend in the first direction D1. The first fin F1 and the second fin F2 may be formed by partially etching the substrate 102 and may include a material identical or similar to that of the substrate 102. The element isolation layer 106 may be disposed on the substrate 102 and may fill in a part of the recessed region 104 formed between the first fin F1 and the second fin F2. The first fin F1 may be divided into the upper region F1U and the lower region F1L. A side wall of the lower region F1L of the first fin F1 may be surrounded by the element isolation layer 106, and the upper region F1U of the first fin F1 may protrude from an upper surface of the element isolation layer 106. The second fin F2 may be divided into the upper region F2U protruding from the upper surface of the element isolation layer 106, and the lower region F2L a side wall of which is surrounded by the element isolation layer 106.

Referring to FIG. 12, a dummy gate structure may be formed on the first fin F1, the second fin F2, and the element isolation layer 106. The dummy gate structure may include the dummy gate insulating layer 110, a dummy gate electrode 111, and a dummy capping layer 114. The dummy gate structure may be disposed to extend in the second direction D2 and may cover the side surfaces and the upper surface of each of the first fin F1 and the second fin F2.

The dummy gate insulating layer 110 may include silicon oxide and may be formed by chemical vapor deposition (CVD) and/or atomic layer deposition (ALD). The dummy gate electrode 111 may include polysilicon. The dummy capping layer 114 may be formed of silicon nitride, silicon oxynitride, or a combination thereof.

Referring to FIG. 13, a fin spacer 120 may be formed on side surfaces of the first fin F1 and the second fin F2, and the gate spacer 122 may be formed on a side surface of the dummy gate structure. For example, after an insulating layer is deposited on upper surfaces of the first fin F1, the second fin F2, the dummy gate structure, and the element isolation layer 106, the insulating layer may be anisotropically etched. The fin spacer 120 and the gate spacer 122 may be formed by partially removing the insulating layer formed on the upper surfaces of the first fin F1, the second fin F2, the dummy gate structure, and the element isolation layer 106. The gate spacer 122 is not removed during a subsequent etching process such that the gate electrode 170 may be protected.

The fin spacer 120 may not cover the upper surfaces of the first fin F1 and the second fin F2, and thus the upper surfaces of the first fin F1 and the second fin F2 may be exposed. Each of the fin spacer 120 and the gate spacer 122 may be constituted of one or more layers and may include silicon nitride, silicon oxynitride, or a combination thereof. The gate spacer 122 may not cover an upper surface of the dummy capping layer 114. The gate spacer 122 may include a material identical or similar to that of the fin spacer 120.

Referring to FIG. 14, the source/drain regions 130 may be formed on the first fin F1 and the second fin F2. The source/drain regions 130 may be formed on both sides of the dummy gate structure. For example, the source/drain regions 130 may be located on an outer surface of the gate spacer 122. The source/drain regions 130 may be formed by selective epitaxial growth (SEG). For example, parts of the upper regions F1U and F2U of the first fin F1 and the second fin F2 on both sides of the dummy gate structure may be removed to form a recess. In an example embodiment, the lower region F1L of the first fin F1 and the lower region F2L of the second fin F2 may also be partially etched during the recess process. Although the fin spacer 120 has been shown as being completely removed, the fin spacer 120 has etch selectivity with respect to the first fin F1 and the second fin F2 such that a part of the fin spacer 120 may remain in the recess process. Parts of the first fin F1 and the second fin F2 exposed by the recess may be doped with suitable ions according to a type of a transistor.

For example, a fin used in source/drain regions 130 of a PMOS transistor may be doped with a p-type impurity. Boron (B), gallium (Ga), and/or the like may be used as the p-type impurity. SEG may be performed on the doped upper portions of the first fin F1 and the second fin F2. Silane (SiH$_4$) gas, disilane (S1$_2$H$_6$) gas, dichlorosilane (SiH$_2$Cl$_2$) gas, and/or the like may be used as a silicon source gas, GeH$_4$ gas may be used as a germanium source gas, hydrogen chloride (HCl) gas may be used as an etching gas, and hydrogen (H$_2$) gas may be used as a carrier gas.

Fins used in source/drain regions 130 of an NMOS transistor may be doped with an n-type impurity. Phosphorus (P), arsenic (As), and/or the like may be used as the n-type impurity. In subsequent SEG, SiH$_4$ gas, S1$_2$H$_6$ gas, SiH$_2$Cl$_2$ gas, and/or the like may be used as a silicon source gas. SiH$_3$CH$_3$ gas may be used as a carbon source gas, HCl gas may be used as an etching gas, and H$_2$ gas may be used as a carrier gas.

The source/drain regions 130 may have different growth according to a crystal direction. For example, the source/drain regions 130 may have pentagonal cross sections. The source/drain regions 130 may be grown from upper portions of the first fin F1 and the second fin F2 and be integrally coupled.

When the source/drain regions 130 are formed, the dummy gate electrode 111 may also be doped. For example, the dummy gate electrode 111 may be polysilicon doped with an n-type impurity. In an example embodiment, the dummy gate electrode 111 may be polysilicon doped with a p-type impurity. Although not shown in FIG. 14, a separate process of doping the dummy gate electrode 111 may be performed.

Referring to FIG. 15, the interlayer insulating layer 132 may be formed on the source/drain regions 130. The interlayer insulating layer 132 may include silicon oxide, silicon nitride, silicon oxynitride, phosphosilicate glass (PSG), borophosphosilicate glass (BPSG), a low-k dielectric material, and/or one among differently applicable dielectric materials, or a multiple layer made of a plurality of layers. In an example embodiment, the interlayer insulating layer 132 may include silicon oxide. The interlayer insulating layer 132 may be formed by CVD, physical vapor deposition (PVD), ALD, spin-on coating, and/or the like.

Although not shown in FIG. 15, an etch stop layer may be formed on upper portions of the source/drain regions 130. The interlayer insulating layer 132 may not completely fill in lower portions of the source/drain regions 130.

Referring to FIG. 16, a part of the dummy gate electrode 111 may be removed. In an example embodiment, a photomask 140 may be formed to cover an upper portion of the first fin F1 and to not cover an upper portion of the second fin F2. A part of the dummy gate electrode 111 may be removed by dry etching. A gas such as Cl$_2$, HBr, SF$_6$, and/or CF$_4$ may be used for etching. The dummy gate electrode 112 may be formed by etching. The dummy gate electrode 112 may cover the first fin F1 and may not cover the second fin F2. The element isolation layer 106 covering parts of the second fin F2 and the dummy gate insulating layer 110 may also be etched. In FIG. 16, the dummy gate electrode 112 has been shown as covering both of the side surface and the upper surface of the first fin F1, but the inventive concepts are not limited thereto. In an example, the dummy gate electrode 112 may be formed to cover entirely, or only partially, the side surface of the first fin F1.

Referring to FIG. 17, the gate structure may be formed on the exposed second fin F2 and the element isolation layer 106. The gate structure may include the interface layer 150, the gate oxide layer 151, the gate dielectric layer 155, the work function adjusting layer 160, and the gate electrode 170. The interface layer 150 is able to prevent or reduce a defective interface between the second fin F2 and the gate dielectric layer 155. The interface layer 150 may include a low-k material. In an example embodiment, the interface layer 150 may include silicon oxide. The interface layer 150 may be formed on a surface of the upper region F2U of the second fin F2 by oxidizing silicon. When the interface layer 150 is formed by CVD and/or ALD, the interface layer 150 may also be formed on an upper surface of the element isolation layer 106. The interface layer 150 may have a thickness that is less than that of the dummy gate insulating layer 110. The gate oxide layer 151 may be formed on a side surface of the dummy gate electrode 112 in the first direction D1.

A gate dielectric layer 155 may be formed on the element isolation layer 106 and the interface layer 150. The gate dielectric layer 155 may include a high-k material. For example, the gate dielectric layer 155 may include hafnium silicon oxynitride (HfSiON), hafnium oxide (HfO$_2$), zirconium oxide (ZrO$_2$), tantalum pentoxide (Ta$_2$O$_5$), titanium dioxide (TiO$_2$), strontium titanate (SrTiO$_3$), and/or barium titanate (BaTiO$_3$). In an example embodiment, the gate dielectric layer 155 may include HfO$_2$. The gate dielectric layer 155 may be formed by CVD, ALD, and/or other processes.

The work function adjusting layer 160 may be formed on the gate dielectric layer 155. The work function adjusting layer 160 may adjust a work function to allow (e.g., cause, configure or fabricate) the semiconductor device 100 to have an appropriate threshold voltage. The work function adjusting layer 160 may be constituted of one or more layers. The work function adjusting layer 160 may include TiAl, and/or metal nitride such as TiAlN, TaCN, TaN, TaAlN and/or the like.

The gate electrode 170 may be formed on the work function adjusting layer 160 to at least partially fill in the remaining space of the gate line GL. The gate electrode 170 may include aluminum, copper, titanium, tantalum, tungsten, molybdenum, tantalum nitride, nickel silicide, cobalt silicide, TiN, WN, TiAl, TiAlN, TaCN, TaC, TaSiN, a metal alloy, or a combination thereof. In an example embodiment, the gate electrode 170 may include tungsten. Although not shown in FIG. 17, in an example embodiment, the gate structure may further include a capping layer, an etch stop layer, and/or a barrier layer.

As shown in FIG. 17, the gate electrode 170 may be formed by leaving a part of the dummy gate electrode 112 such that the gate oxide layer 151, the gate dielectric layer 155, and the work function adjusting layer 160 may be formed on the side surface of the dummy gate electrode 112 in the first direction D1. The gate oxide layer 151, the gate dielectric layer 155, and the work function adjusting layer 160 may be located between the dummy gate electrode 112 and the gate electrode 170. Since the dummy gate electrode 112 has a work function different from that of the work function adjusting layer 160, a work function of the semiconductor device 100 may be adjusted by controlling an amount of the residual dummy gate electrode 112. As described above, the dummy gate electrode 112 is doped to have conductivity such that the dummy gate electrode 112 is able to serve as a configuration of a transistor.

As shown in FIGS. 16 and 18, when the dummy gate electrode 112 partially remains instead of being entirely removed, the photomask 140 is used once such that the semiconductor device 100 having a threshold voltage different from that of the semiconductor device 200 may be formed. Generally, in order to implement multiple threshold voltages, the formation of a mask, deposition, and etching are not performed multiple times such that costs may be reduced due to a simplified process, and a size of a mask is variously adjusted such that the threshold voltage may be easily controlled.

Referring to FIG. 18, a capping layer 180 may be formed on the element isolation layer 106, the dummy gate electrode 112, and the gate electrode 170. The capping layer 180 may protect the dummy gate electrode 112 and the gate electrode 170. In FIG. 18, the capping layer 180 has been shown as being formed even on the element isolation layer 106. However, in an example embodiment, the capping layer 180 may be disposed on only the gate structure (e.g., the dummy gate electrode 112 and the gate electrode 170). Further, in a subsequent process, an insulating material may further be disposed over the element isolation layer 106 and/or the capping layer 180.

Figure 25:
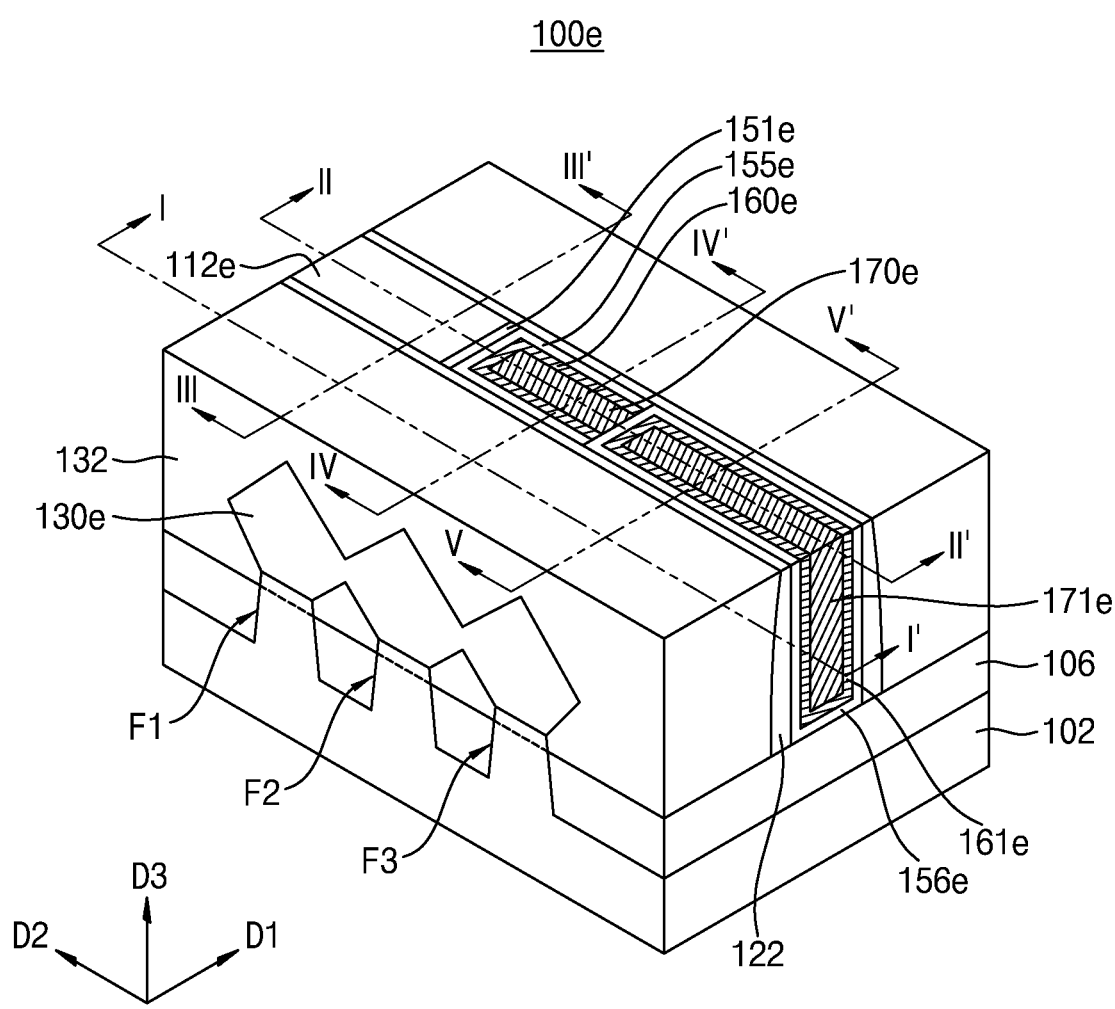
FIG. 25 is a perspective view illustrating the semiconductor device according to an example embodiment of the inventive concepts.
Figure 26:
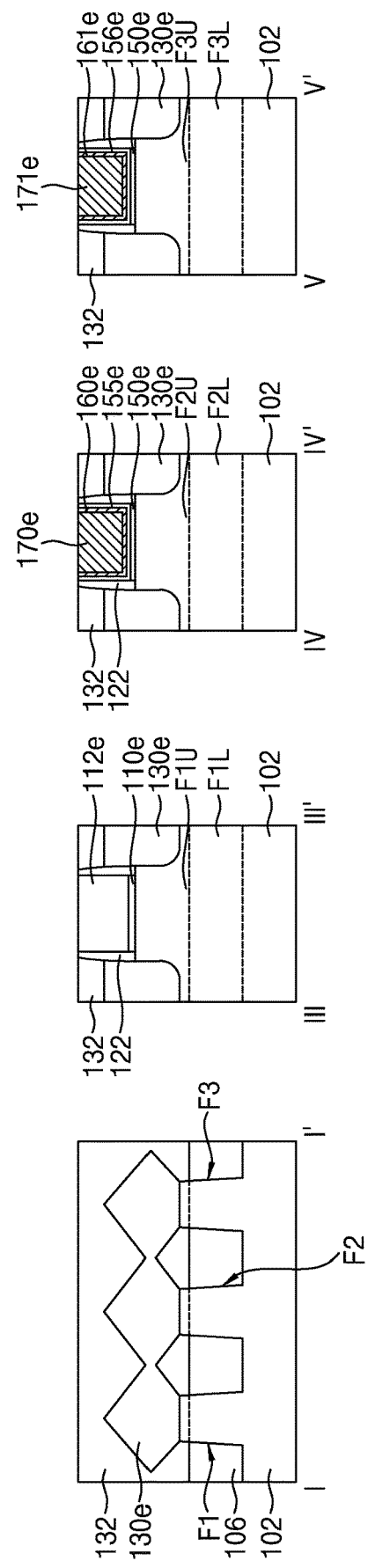
FIG. 26 depicts vertical cross-sectional views take along lines I-I', III-III', IV-IV', and V-V' of the semiconductor device shown in FIG. 25.

FIGS. 19 to 24 are cross-sectional views, which are illustrated according to the order of processes, for describing a method of manufacturing a semiconductor device 100e according to an example embodiment of the inventive concepts. FIG. 25 is a perspective view illustrating the semiconductor device 100e according to an example embodiment of the inventive concepts. FIG. 26 is vertical cross-sectional views take along lines I-I', III-III', IV-IV', and V-V' of the semiconductor device 100e shown in FIG. 25.

FIGS. 19 to 24 may correspond to a cross-sectional view taken along line II-II' of the semiconductor device 100e shown in FIG. 25. Referring to FIGS. 11 and 19, the first fin F1, the second fin F2, the third fin F3, and the element isolation layer 106 may be prepared on the substrate 102. The first fin F1, the second fin F2, and third fin F3 may be disposed on the substrate 102 to protrude in the third direction D3 and extend in the first direction D1.

The element isolation layer 106 may be disposed on the substrate 102 to cover side surfaces of the lower regions F1L, F2L, and F3L of the first fin F1, the second fin F2, and third fin F3, respectively. The first fin F1 may be divided into the upper region F1U and the lower region F1L. A side wall of the lower region F1L of the first fin F1 may be surrounded (e.g., covered) by the element isolation layer 106, and the upper region F1U of the first fin F1 may protrude from an upper surface of the element isolation layer 106. The second fin F2 and the third fin F3 may have a structure identical or similar to that of the first fin F1.

Referring to FIGS. 12 and 20, a dummy gate structure may be formed on the first fin F1, the second fin F2, the third fin F3, and the element isolation layer 106. The dummy gate structure may be formed to surround the first fin F1, the second fin F2, and the third fin F3 and extend in the second direction D2. For example, the dummy gate structure may cover side surfaces and upper surfaces the first fin F1, the second fin F2 and the third fin F3. The dummy gate structure may include a dummy gate insulating layer 110e, a dummy gate electrode 111e, and a dummy capping layer 114e. The dummy gate insulating layer 110e may include silicon oxide, and the dummy gate electrode 111e may include polysilicon. The dummy capping layer 114e may be formed of silicon nitride, silicon oxynitride, or a combination thereof.

Referring to FIGS. 16 and 21, a part of the dummy gate electrode 111e may be removed using a photomask 140e to form a dummy gate electrode 112e. In an example embodiment, the photomask 140 may be disposed to cover an upper portion of the first fin F1 and to not cover upper portions of the second fin F2 and the third fin F3. A part of the exposed dummy gate electrode 111e may be removed by dry etching. The dummy gate electrode 112e may cover the first fin F1 and may not cover the second fin F2 and the third fin F3. The second fin F2, the third fin F3, and the dummy gate insulating layer 110e covering a part of the element isolation layer 106 may also be etched.

Referring to FIGS. 17 and 22, a gate structure may be formed on the exposed second fin F2, the exposed third fin F3, and the exposed element isolation layer 106. The gate structure may include an interface layer 150e, a gate oxide layer 151e, a gate dielectric layer 155e, a work function adjusting layer 160e, and a gate electrode 170e. The interface layer 150e may be formed on surfaces of the upper regions F2U and F3U of the second fin F2 and the third fin F3. The gate oxide layer 151e may be formed between the dummy gate electrode 112e and the gate electrode 170e.

Referring to FIG. 23, a part of the gate electrode 170e may be removed. The photomask 141e covering the upper portions of the first fin F1 and the second fin F2 and not covering the upper portion of the third fin F3 may be formed first. A part of the exposed gate electrode 170e may be removed by dry etching. The etched gate electrode 170e may cover the second fin F2 and may not cover the first fin F1 and the third fin F3. The interface layer 150e covering the upper region F3U of the third fin F3 may not be removed.

Referring to FIG. 24, a gate dielectric layer 156e, a work function adjusting layer 161e, and a gate electrode 171e may be formed on the exposed third fin F3 and the exposed element isolation layer 106. The gate dielectric layer 156e and the work function adjusting layer 161e may be sequentially deposited to cover the third fin F3 and may be formed on a side surface of the gate electrode 170e to be disposed between the gate electrodes 170e and 171e. The gate electrode 171e may fill in all or substantially all of the remaining space.

FIG. 25 is a perspective view of the semiconductor device 100e manufactured by the manufacturing method according to FIGS. 19 to 24. FIG. 26 depicts the vertical cross-sectional views take along the lines I-I', III-III', IV-IV', and V-V' of the semiconductor device 100e shown in FIG. 25.

Referring to FIGS. 25 and 26, source/drain regions 130e may be disposed on the first fin F1, the second fin F2, and the third fin F3 outside the gate spacer 122. The source/drain regions 130e may include an n-type impurity or a p-type impurity. Referring to the vertical cross-sectional view taken along the line III-III' along the first fin F1, the dummy gate insulating layer 110e and the dummy gate electrode 112e may be disposed on the first fin F1. Referring to the vertical cross-sectional view taken along the line IV-IV' along the second fin F2, the interface layer 150e, the gate dielectric layer 155e, the work function adjusting layer 160e, and the gate electrode 170e may be disposed on the second fin F2. Referring to the vertical cross-sectional view taken along the line V-V' along the third fin F3, the interface layer 150e, the gate dielectric layer 156e, the work function adjusting layer 161e, and the gate electrode 171e may be disposed on the third fin F3.

According to the manufacturing method shown in FIGS. 19 to 24, the gate electrodes 170e and 171e may be formed by different processes so that the gate electrodes 170e and 171e may include different materials. The work function adjusting layers 160e and 161e may also include different materials. In an example embodiment, a threshold voltage may be adjusted by changing the materials of the gate electrodes 170e and/or 171e and/or the work function adjusting layers 160e and 161e. In FIG. 24, the dummy gate electrode 112e and the gate electrodes 170e and 171e have been shown as being of substantially the same size. However, in an example, a threshold voltage may be adjusted by differentiating widths of the dummy gate electrode 112e and/or the gate electrodes 170e and/or 171e in the second direction D2.

Figure 27:
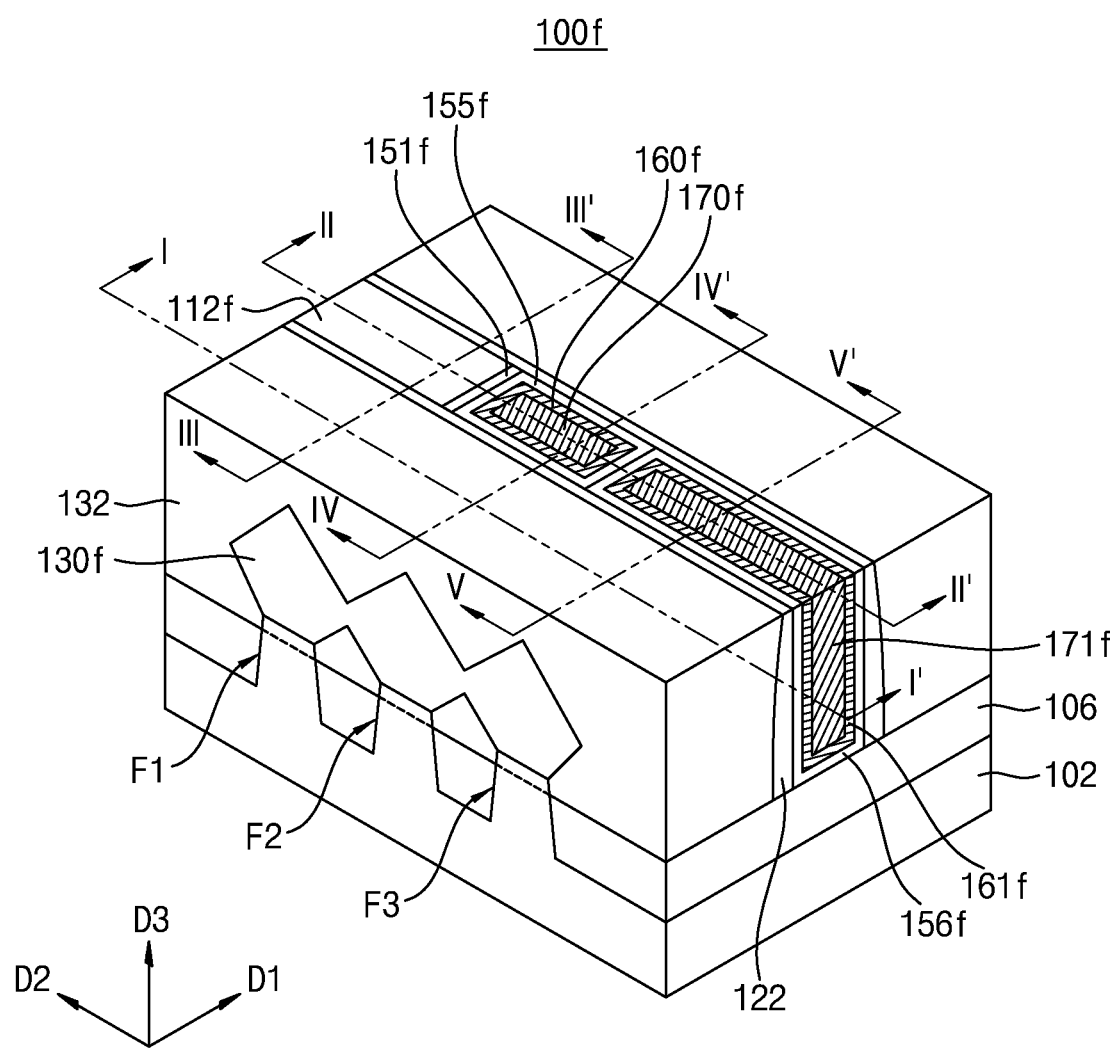
FIGS. 27 to 31 are cross-sectional views of semiconductor devices according to some example embodiments of the inventive concepts.

FIG. 27 is a perspective view illustrating a semiconductor device 100f according to an example embodiment of the inventive concepts.

Referring to FIG. 27, the semiconductor device 100f may include the first fin F1, the second fin F2, and the third fin F3. The semiconductor device 100f may also include a dummy gate electrode 112f, a gate electrode 170f, and a gate electrode 171f, which are disposed on the first fin F1, the second fin F2, and the third fin F3, respectively. A gate dielectric layer 155f and a work function adjusting layer 160f may be disposed between a gate spacer 122 and the gate electrode 170f, and a gate dielectric layer 156f and a work function adjusting layer 161f may be disposed between the gate spacer 122 and the gate electrode 171f. The semiconductor device 100f may further include source/drain regions 130f disposed on the first to third fins F1, F2, and F3 outside the gate spacer 122.

In FIGS. 19 to 24, the gate material has been shown as being formed in the order of the first fin F1, the second fin F2, and the third fin F3, but the inventive concepts are not limited thereto. In an example, the gate material may be formed in the order of the first fin F1, the third fin F3, and the second fin F2. Specifically, with regard to the semiconductor device 100f depicted in FIG. 27, after the dummy gate electrode 112f is formed, only the third fin F3 may be exposed and then the gate dielectric layer 156f, the work function adjusting layer 161f, and the gate electrode 171f may be formed. Next, the second fin F2 may be exposed and then the gate dielectric layer 155f, the work function adjusting layer 160f, and the gate electrode 170f may be formed. When viewed from the top, the work function adjusting layer 160f may be disposed to surround the gate electrode 170f, and the gate dielectric layer 155f may be disposed to surround the work function adjusting layer 160f.

Figure 28:
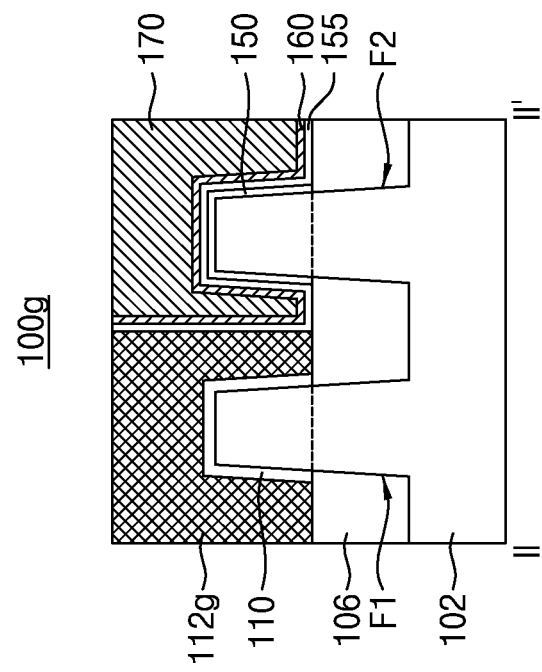

FIG. 28 is a cross-sectional view of a semiconductor device 100g according to an example embodiment of the inventive concepts. FIG. 28 is an example embodiment corresponding to the cross-sectional view taken along the line II-II' of FIG. 3.

Referring to FIG. 28, the semiconductor device 100g may include a dummy gate electrode 112g. The dummy gate electrode 112g may include a conductive material such as a metal, a metal nitride, and/or the like. For example, the dummy gate electrode 112g may include aluminum, copper, titanium, tantalum, tungsten, molybdenum, tantalum nitride, nickel silicide, cobalt silicide, TiN, WN, TiAl, TiAlN, TaCN, TaC, TaSiN, TaN, or a combination thereof.

The interface layer 150 may be disposed on the upper region F2U of the second fin F2, and the interface layer 150 may not be formed between the dummy gate electrode 112g and the gate electrode 170. As shown in FIG. 28, when the dummy gate electrode 112g includes a metal and/or a metal nitride, the interface layer 150 may not be formed on a surface of the dummy gate electrode 112g. In an example embodiment, a metal oxide may be formed between the dummy gate electrode 112g and the work function adjusting layer 160. The semiconductor device 100g may have an operating speed that is higher than that of a case in which polysilicon is used in the dummy gate electrode 112.

Figure 29:
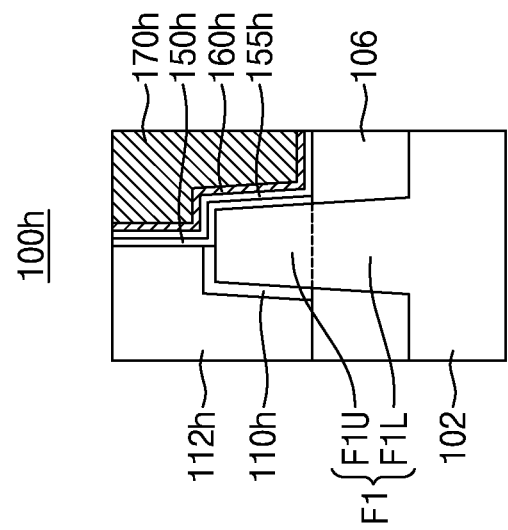

FIG. 29 is a cross-sectional view of a semiconductor device 100h according to an example embodiment of the inventive concepts. FIG. 29 is an example embodiment corresponding to the cross-sectional view taken along the line II-II' of FIG. 3.

Referring to FIG. 29, the semiconductor device 100h may include a single fin F1. A dummy gate electrode 112h and a gate electrode 170h may be disposed by interposing the fin F1 therebetween. The dummy gate electrode 112h may cover one side surface of the fin F1, and the gate electrode 170h may cover the other side surface of the fin F1. A dummy gate insulating layer 110h may be disposed below the dummy gate electrode 112h. A work function adjusting layer 160h and a gate dielectric layer 155h may be disposed below the gate electrode 170h. An interface layer 150h may be disposed along a side surface of the dummy gate electrode 112h, and an upper surface and the other side surface of the fin F1.

In an example embodiment, an area ratio of the dummy gate electrode 112h to the semiconductor device 100h may be different from an area ratio of the gate electrode 170h to the semiconductor device 100h. Semiconductor devices having different area ratios of dummy gate electrodes to gate electrodes may be provided in an SRAM device, a CMOS device, and/or the like.

Figure 30:
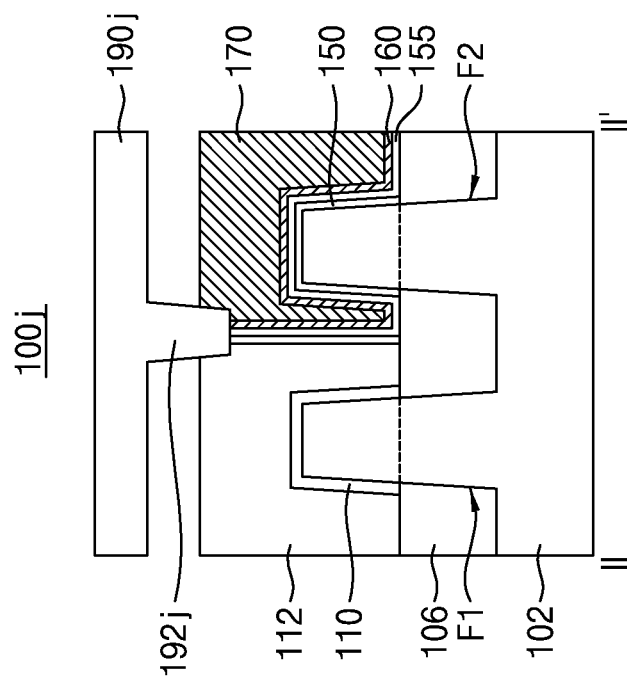

FIG. 30 is a cross-sectional view of a semiconductor device 100i according to an example embodiment of the inventive concepts. FIG. 30 is an example embodiment corresponding to the cross-sectional view taken along the line II-II' of FIG. 3.

Referring to FIG. 30, a semiconductor device 100i may include a gate contact 190i with a contact plug 192i and a contact plug 194i. The contact plug 192i may be connected to the dummy gate electrode 112, and the contact plug 194i may be connected to the gate electrode 170. A lower surface of the contact plug 192i may be located at a level that is lower than an upper surface of the dummy gate electrode 112, and a lower surface of the contact plug 194i may be located at a level that is lower than an upper surface of the gate electrode 170. However, the inventive concepts are not limited thereto. The contact plug 192i and the contact plug 194i may be connected to the gate contact 190i, and the dummy gate electrode 112 and the gate electrode 170 may be electrically connected through the gate contact 190i. Each of the gate contact 190i, the contact plug 192i, and the contact plug 194i may include a metal material such as cobalt, tungsten, a metal silicide, and/or the like. Although not shown in the drawing, a barrier material may be disposed between the dummy gate electrode 112 and the contact plug 192i, and between the gate electrode 170 and the contact plug 194i. The barrier material may include titanium nitride, tantalum nitride, and/or the like.

Figure 31:
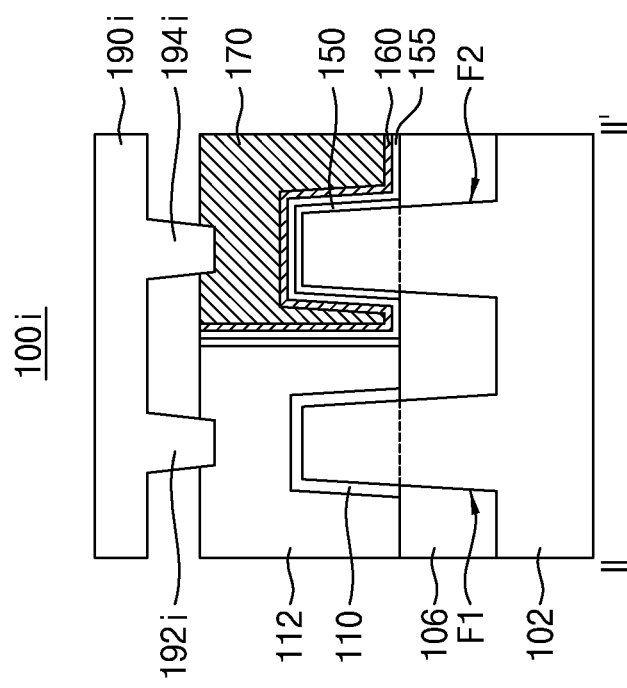

FIG. 31 is a cross-sectional view of a semiconductor device 100j according to an example embodiment of the inventive concepts. FIG. 31 is an example embodiment corresponding to the cross-sectional view taken along the line II-II' of FIG. 3.

Referring to FIG. 31, a semiconductor device 100j may include a gate contact 190j with a contact plug 192j. The contact plug 192j may be disposed between the dummy gate electrode 112 and the gate electrode 170. A lower surface of the contact plug 192j may be located at a level that is lower than an upper surface of the dummy gate electrode 112 and an upper surface of the gate electrode 170. The contact plug 192j may electrically connect the dummy gate electrode 112 to the gate electrode 170.

According to some example embodiments of the inventive concepts, a semiconductor device may include a dummy gate electrode containing polysilicon and a gate electrode such that multiple threshold voltages may be implemented with a relatively simplified process by adjusting a work function through the dummy gate electrode.

Spatially relative terms, such as "beneath," "below," "lower," "above," "upper" and the like, may be used herein for ease of description to describe one element or feature's relationship to another element(s) or feature(s) as illustrated in the figures. For example, as used herein, the terms "upper," "higher," "on" and/or "top" may refer to an element or feature further in the third direction D3 (as depicted in FIG. 2) with respect to another element or feature, and the terms "lower" and/or "below" may refer to an element or feature further in a direction opposite the third direction D3 with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. As used herein the term "and/or" includes any and all combinations of one or more of the associated listed items.

Some example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor device comprising:
    a first fin that protrudes from a substrate and extends in a first direction;
    a second fin that protrudes from the substrate and extends in the first direction, the first fin and the second fin being spaced apart;
    a gate line including a dummy gate electrode and a gate electrode, the dummy gate electrode at least partially covering the first fin, the gate electrode at least partially covering the second fin, the dummy gate electrode including different materials from the gate electrode, the gate line covering the first fin and the second fin, the gate line extending in a second direction different from the first direction, and the dummy gate electrode being included in a same transitor; and
    a gate dielectric layer between the gate electrode and the second fin,
    wherein the gate electrode extends continuously from the dummy gate electrode so that the gate electrode and the dummy gate electrode are formed over common line of extent.

2. The semiconductor device of claim 1, wherein a side surface of the dummy gate electrode with respect to the first direction is between the first fin and the second fin.

3. The semiconductor device of claim 1, wherein
    a side surface of the dummy gate electrode with respect to the first direction is above the first fin,
    the dummy gate electrode covers a first side surface of the first fin, and
    the gate electrode covers the second fin and a second side surface of the first fin.

4. The semiconductor device of claim 1, wherein
    a side surface of the dummy gate electrode with respect to the first direction is above the first fin,
    the dummy gate electrode covers a first side surface of the first fin, and
    the gate electrode covers the dummy gate electrode, a second side surface of the first fin, and the second fin.

5. The semiconductor device of claim 1, wherein
    an upper surface of the dummy gate electrode is at a lower level than an upper end of the first fin,
    the dummy gate electrode covers a first part of a first side surface of the first fin, and
    the gate electrode covers the dummy gate electrode, an upper surface of the first fin, a second side surface of the first fin, and the second fin.

6. The semiconductor device of claim 1, wherein a width of the dummy gate electrode in the first direction is wider than a width of the gate electrode in the first direction.

7. The semiconductor device of claim 1, wherein a lower surface of the dummy gate electrode is at a lower level than a lower surface of the gate electrode.

8. The semiconductor device of claim 1, further comprising:
    a dummy gate insulating layer between the first fin and the dummy gate electrode.

9. The semiconductor device of claim 1, wherein the gate dielectric layer covers a side surface of the dummy gate electrode with respect to the first direction.

10. The semiconductor device of claim 9, wherein the gate dielectric layer extends in the second direction.

11. The semiconductor device of claim 1, further comprising:
    a gate oxide layer between a side surface of the dummy gate electrode with respect to the first direction and the gate dielectric layer.

12. The semiconductor device of claim 11, further comprising:

a work function adjusting layer on the gate dielectric layer, the second fin and the side surface of the dummy gate electrode.

13. The semiconductor device of claim 11, wherein
the dummy gate electrode includes a metal, and
the gate dielectric layer covers the side surface of the dummy gate electrode.

14. A semiconductor device comprising:
a first fin that protrudes from a substrate and extends in a first direction;
a second fin that protrudes from the substrate and extends in the first direction;
a third fin that protrudes from the substrate and extends in the first direction, the first fin, the second fin and the third fin being spaced apart;
a gate line including a dummy gate electrode, a first gate electrode and a second gate electrode, the dummy gate electrode covering the first fin, the first gate electrode covering the second fin, the second gate electrode covering the third fin, the dummy gate electrode including different materials from the first gate electrode and the second gate electrode, the gate line extending in a second direction different from the first direction;
a first gate dielectric layer between the first gate electrode and the second fin; and
a second gate dielectric layer between the second gate electrode and the third fin,
wherein the first and second gate electrodes extend continuously from the dummy gate electrode so that the first and second gate electrodes and the dummy gate electrode are formed over common line of extent.

15. The semiconductor device of claim 14, wherein the first gate electrode and the second gate electrode include different materials.

16. The semiconductor device of claim 14, further comprising:
a first work function adjusting layer between the first gate electrode and the first gate dielectric layer; and
a second work function adjusting layer between the second gate electrode and the second gate dielectric layer, the first work function adjusting layer and the second work function adjusting layer including different materials.

17. The semiconductor device of claim 14, wherein the first gate dielectric layer covers a side surface of the dummy gate electrode with respect to the first direction.

18. The semiconductor device of claim 17, further comprising:
a gate oxide layer between the first gate dielectric layer and the side surface of the dummy gate electrode.

19. The semiconductor device of claim 14, wherein the second gate dielectric layer covers a side surface of the first gate electrode with respect to the first direction.

20. A semiconductor device comprising:
a fin that protrudes from a substrate and extends in a first direction;
a gate line including a dummy gate electrode and a gate electrode, the dummy gate electrode covering a first side surface of the fin, the gate electrode covering a second side surface of the fin, the dummy gate electrode including different materials from the gate electrode, the gate line covering the fin and extending in a second direction different from the first direction;
a dummy gate insulating layer between the dummy gate electrode and the fin; and
a gate dielectric layer between the gate electrode and the fin.

* * * * *

UNITED STATES PATENT AND TRADEMARK OFFICE
CERTIFICATE OF CORRECTION

| | | |
|---|---|---|
| PATENT NO. | : 11,563,002 B2 | |
| APPLICATION NO. | : 16/418366 | |
| DATED | : January 24, 2023 | |
| INVENTOR(S) | : Jin Woo Kim et al. | |

It is certified that error appears in the above-identified patent and that said Letters Patent is hereby corrected as shown below:

On the Title Page

In the Inventors (item (72)), Line 6, the Inventor listed as "Hyun Chui Sagong, Hwaseong-si (KR)" should be listed as --Hyun Chul Sagong, Hwaseong-si (KR)--

Signed and Sealed this
Fifth Day of September, 2023

Katherine Kelly Vidal
*Director of the United States Patent and Trademark Office*